(12) United States Patent
Koyama

(10) Patent No.: US 7,956,778 B2
(45) Date of Patent: Jun. 7, 2011

(54) ANALOG-TO-DIGITAL CONVERTER

(75) Inventor: Tetsuhiro Koyama, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 12/656,490

(22) Filed: Feb. 1, 2010

(65) Prior Publication Data

US 2010/0214141 A1    Aug. 26, 2010

(30) Foreign Application Priority Data

Feb. 24, 2009   (JP) .................................. 2009-040552

(51) Int. Cl.
    *H03M 1/66*  (2006.01)
(52) U.S. Cl. ......................... 341/131; 341/143; 341/155
(58) Field of Classification Search .................. 341/131, 341/143
    See application file for complete search history.

(56) References Cited

U.S. PATENT DOCUMENTS

| 4,395,701 A * | 7/1983 | Evans ........................... 341/131 |
| 4,766,417 A * | 8/1988 | Takayama et al. ............ 341/118 |
| 5,245,343 A * | 9/1993 | Greenwood et al. ......... 341/143 |
| 5,416,481 A * | 5/1995 | Chen ............................. 341/131 |
| 7,750,612 B2 * | 7/2010 | Yokosawa ...................... 323/282 |
| 2007/0115037 A1 | 5/2007 | Yokosawa |

FOREIGN PATENT DOCUMENTS

| JP | 7-58907 | 6/1995 |
| JP | 2007-139700 | 6/2007 |

* cited by examiner

*Primary Examiner* — Khai M Nguyen
(74) *Attorney, Agent, or Firm* — McGinn IP Law Group, PLLC

(57) ABSTRACT

There is provided an analog-to-digital converter capable of performing analog-to-digital conversion with good accuracy. The analog-to-digital converter in accordance with the present invention includes a dither generation circuit 11 which generates dither; an input polarity switching unit 1 which switches a polarity of an input signal; an integrator 2; an integrator output regulator circuit 5 which regulates an output voltage of the integrator 2; a window comparator 3; a control circuit 4 which uses the comparison result of the window comparator 3 to control the input polarity switching unit 1, the integrator output regulator circuit 5, and the window comparator 3 as well as to generate a digital signal. The dither generation circuit 11 generates dither in such a manner that a cycle in which the digital signal is read is an integral multiple of a dither cycle. Further, the dither generation circuit 11 generates dither in such a manner that the number of times the count value is generated in the first half of one cycle of the dither is different from the number of times the count value is generated in the second half cycle thereof.

8 Claims, 17 Drawing Sheets

ANALOG-TO-DIGITAL CONVERTER

BACKGROUND OF THE INVENTION

1. Field of the Invention

The present invention relates to an analog-to-digital converter converting an analog signal to a digital signal.

2. Description of the Related Art

Recently, analog-to-digital converters (ADCs) converting analog signals to digital signals have been used in various fields. FIG. 16 illustrates a VF type ADC converting voltage to frequency disclosed in Japanese Patent Laid-Open No. 2007-139700.

In FIG. 16, a voltage-to-pulse converter 100 includes an input switching circuit 104; an integrator output guiding unit 105 as a voltage guiding unit; an integrator 108; first and second comparators 112 and 113 (window comparator); an RS latch circuit 114; first and second integrator output error detection circuits 116 and 119; OR circuits 120 and 122; first and second comparator continuous output judgement circuits 117 and 118; and a flip-flop (FF) 123 as a flag output part.

Here, the input switching circuit 104 switches a connection between a CS+ terminal and a CS− terminal, and a positive or negative input terminal of the integrator 108. In addition, the integrator 108 includes a differential amplifier 111; a resistor 109, one end of which is connected to the − terminal (inverting input terminal) of the differential amplifier 111; and a capacitor 110 connected between an output of the differential amplifier 111 and the − terminal.

The integrator output guiding unit 105 includes switches 106 and 107, one end of which is connected to nodes 106a and 106b respectively and the other end of which is connected to a reference potential. The integrator output guiding unit 105 guides an output of the integrator 108 to the vicinity of a first or second detection voltage.

The first and second comparators 112 and 113 detect the voltage from the output of the integrator 108 to a first detection voltage (1V) and a second detection voltage (2V) higher than the first detection voltage.

The FF 123 outputs a flag FLAG based on the comparison result of the first and second comparators 112 and 113. An inverter 124 outputs an output signal CKOUT having a frequency corresponding to an input voltage.

By such an operation, the circuit illustrated in FIG. 16 converts the input voltage generated between the CS+terminal 101 and the CS-terminal 102 to a pulse. The input switching circuit 104 switches the above connection based on the flag FLAG and the output signal CKOUT.

In addition, FIG. 17 illustrates an ADC disclosed in Japanese Patent Laid-Open No. 62-289016. The ADC illustrated in FIG. 17 supplies an input analog voltage via an adder 201 to an ADC 202 which converts it to an output digital value. The ADC illustrated in FIG. 17 feeds back an offset correction voltage from a feedback circuit 203 to the adder 201. If the analog voltage does not contain a residual noise exceeding a predetermined level, dither is supplied from a dither generation circuit 204 to the adder 201 so as to superimpose noise on the input analog voltage. The feedback circuit 203 supplies a correction voltage based on the output digital values to the adder 201 so that the probabilities of occurrence of the upper and lower codes are equal except a specific output code of the output digital values. This corrects an offset error between a specific level of the input analog voltage and a specific code of the output digital value corresponding to the specific level.

However, if there is an offset in the integrator 108 of the analog-to-digital converter disclosed in the Japanese Patent Laid-Open No. 2007-139700, the offset is superimposed on the input signal and integrated by the integrator. For this reason, there is a problem in that a dead band region occurs in the analog-to-digital converter, thereby reducing the accuracy of the analog-to-digital converter. In particular, the smaller the absolute value of an input signal, the greater the influence of the offset.

Moreover, the analog-to-digital converter disclosed in Japanese Patent Laid-Open No. 62-289016 uses dither to automatically correct an offset error of the AD conversion result. However, it is difficult for the analog-to-digital converter disclosed in Japanese Patent Laid-Open No. 62-289016 to improve the AD conversion accuracy when the input signal has a small absolute value.

SUMMARY

The analog-to-digital converter in accordance with the present invention includes a dither generation circuit which generates dither; an input polarity switching unit which inputs an input signal with the dither and switches a polarity of the input signal with the dither; an integrator which integrates the input signal with the dither outputted from the input polarity switching unit; an integrator output regulator circuit which regulates an output voltage of the integrator; a window comparator which includes a high-voltage-side comparator having a first reference voltage and a second reference voltage higher than the first reference voltage, and a low-voltage-side comparator having a third reference voltage and a fourth reference voltage lower than the third reference voltage, as well as compares an output voltage of the integrator with the first to fourth reference voltages; a control circuit which uses the comparison result of the window comparator to control the input polarity switching unit, the integrator output regulator circuit, and the window comparator as well as to generate a digital signal. The control circuit controls such that when the output voltage of the integrator reaches the first reference voltage or the third reference voltage, a clock signal is inverted, and when the output voltage of the integrator reaches the second reference voltage or the fourth reference voltage, a sign is inverted, and a count value is generated based on the clock signal and the sign. The dither generation circuit generates dither in such a manner that a cycle in which the digital signal is read is an integral multiple of one cycle of the dither as well as the number of times the count value is generated in the first half of one cycle of the dither is different from the number of times the count value is generated in the second half of the one cycle of the dither.

The analog-to-digital converter in accordance with the above configuration can obtain the count value every dither cycle by adding dither to the input signal, and thus can eliminate the dead band region, thereby enabling to improve in the accuracy of the analog-to-digital converter.

The analog-to-digital converter in accordance with the present invention can provide an analog-to-digital converter capable of performing analog-to-digital conversion with good accuracy.

DETAILED DESCRIPTION OF THE PREFERRED EMBODIMENTS

Figure 1:
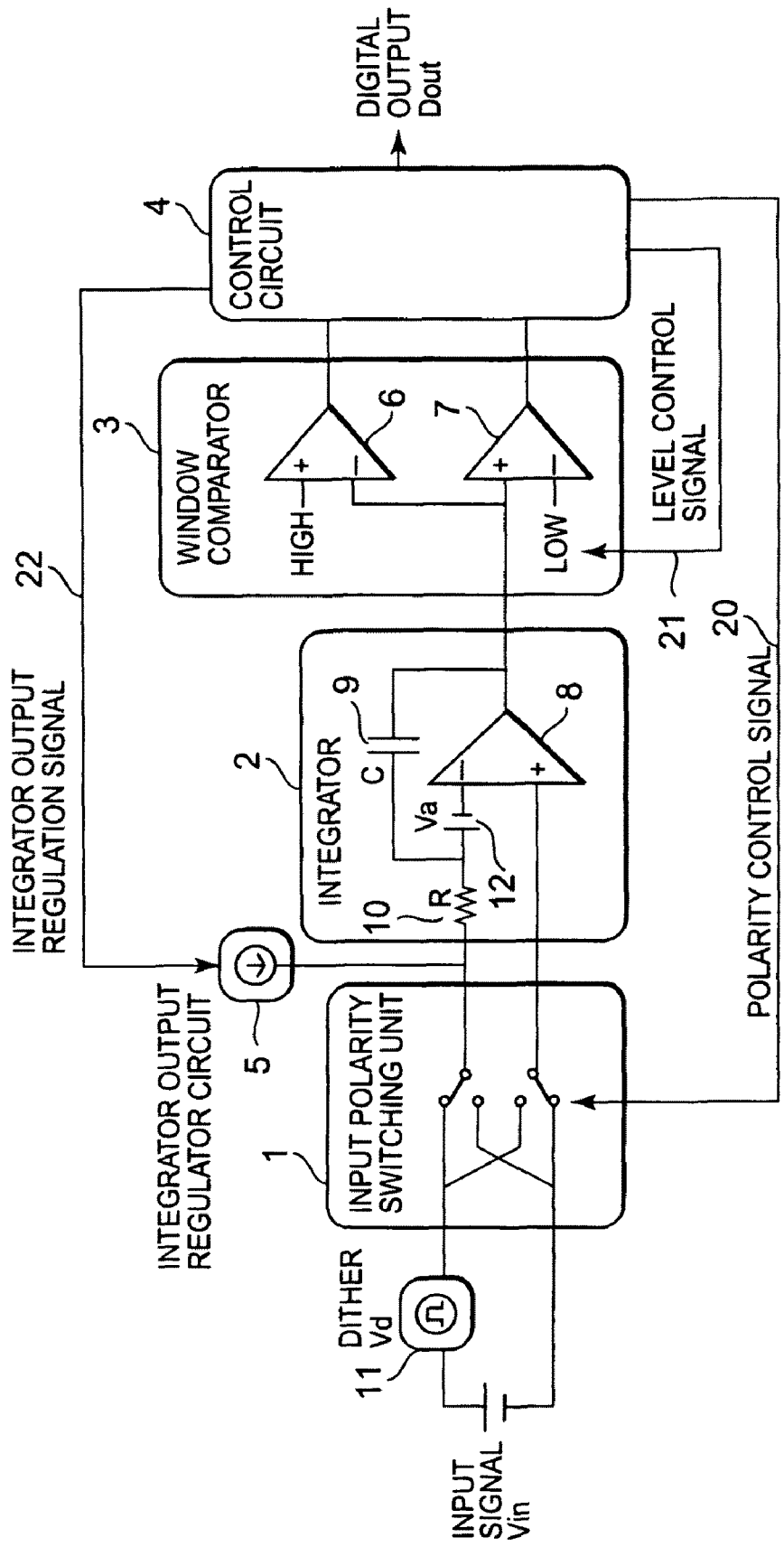
FIG. 1 illustrates an analog-to-digital converter in accordance with an embodiment.

Hereinafter, by referring to accompanying drawings, embodiments of the present invention will be described.

The analog-to-digital converter in accordance with the present embodiment includes a dither generation circuit 11 which generates dither; and an input polarity switching unit 1 which inputs an input signal with dither and switches a polarity of the input signal with the dither. The analog-to-digital converter further includes an integrator 2 which integrates the input signal with the dither outputted from the input polarity switching unit 1; and an integrator output regulator circuit 5 which regulates an output voltage of the integrator 2.

Further, the analog-to-digital converter includes a window comparator 3 which includes a high-voltage-side comparator 6 having a first reference voltage and a second reference voltage higher than the first reference voltage and a low-voltage-side comparator 7 having a third reference voltage and a fourth reference voltage lower than the third reference voltage, as well as compares an output voltage of the integrator 2 with the first to fourth reference voltages.

Further, the analog-to-digital converter includes a control circuit 4 which uses the comparison result of the window comparator 3 to control the input polarity switching unit 1, the integrator output regulator circuit 5, and the window comparator 3 as well as to generate a digital signal.

The control circuit 4 controls such that when the output voltage of the integrator 2 reaches the first reference voltage or the third reference voltage, a clock signal is inverted, and when the output voltage of the integrator 2 reaches the second reference voltage or the fourth reference voltage, a sign is inverted, and a count value is generated based on the clock signal and the sign.

The dither generation circuit 11 generates dither in such a manner that a cycle in which the digital signal is read is an integral multiple of one cycle of the dither. Further, the dither generation circuit 11 generates dither in such a manner that the number of times the count value is generated in the first half of one cycle of the dither is different from the number of times the count value is generated in the second half of the one cycle of the dither. Hereinafter, the analog-to-digital converter in accordance with the present embodiment will be described in detail.

The dither generation circuit 11 generates dither and adds the dither to an input signal Vin to generate a dither signal. The detail about dither generated by the dither generation circuit 11 is described later.

The input polarity switching unit 1 receives an input signal with the dither and outputs the input signal with the dither to the integrator 2. At this time, the input polarity switching unit 1 switches the polarity of the input signal Vin based on a polarity control signal 20 outputted from the control circuit 4. More specifically, the input polarity switching unit 1 switches the following two states based on the polarity control signal 20 from the control circuit 4: (1) a state where a plus-side terminal to which an input signal is applied is connected to the − terminal (inverting input terminal) of a differential amplifier, and a minus-side terminal to which an input signal is applied is connected to a + terminal (non-inverting input terminal) of the differential amplifier; and (2) a state where a plus-side terminal to which an input signal is applied is connected to the + terminal (non-inverting input terminal) of the differential amplifier, and the minus-side terminal to which an input signal is applied is connected to the − terminal (inverting input terminal) of the differential amplifier. This is possible that the output voltage of the integrator 2 to be changed from a negative (or positive) gradient to a positive (or negative) gradient.

The integrator 2 includes a differential amplifier 8; a resistor 10, one end of which is connected to the − terminal (inverting input terminal) of the differential amplifier 8; and a capacitor 9 connected between an output of the differential amplifier 8 and the − terminal. The other end of the resistor 10 and the + terminal (non-inverting input terminal) of the differential amplifier 8 are connected to the plus-side terminal and the minus-side terminal by the input polarity switching unit 1. Moreover, the integrator 2 in accordance with the present embodiment has an offset Va. The offset 12 occurs in the input terminal of the differential amplifier 8.

The window comparator 3 includes the high-voltage-side comparator 6 and the low-voltage-side comparator 7. The + terminal of the high-voltage-side comparator 6 is used as a reference voltage at the high voltage side, and the − terminal thereof is connected to an output of the integrator 2. The reference voltage of the high-voltage-side comparator 6 includes a first reference voltage (High-1) and a second reference voltage (High-2) higher than the first reference voltage.

The comparator 6 compares the output voltage of the integrator 2 with the reference voltages High-1 and High-2, and outputs the comparison result to the control circuit 4. Note that the reference voltages High-1 and High-2 are set based on a level control signal 21 from the control circuit 4.

The − terminal of the low-voltage-side comparator 7 is used as a detection voltage at the low voltage side, and the + terminal thereof is connected to the output of the integrator 2. The reference voltage of the low-voltage-side comparator 6 includes a third reference voltage (Low-1) and a fourth reference voltage (Low-2) lower than the third reference voltage.

The comparator 7 compares the output voltage of the integrator 2 with the reference voltages Low-1 and Low-2 and outputs the comparison result to the control circuit 4. Note that the reference voltages Low-1 and Low-2 are set based on the level control, signal 21 from the control circuit 4.

The control circuit 4 uses the comparison result of the window comparator 3, namely, the outputs of the comparators 6 and 7, to generate a signal for controlling the input polarity switching unit 1, the integrator output regulator circuit 5, and the window comparator 3. More specifically, the control circuit 4 generates the polarity control signal 20 for controlling the input polarity switching unit 1. In addition, the control circuit 4 generates the level control signal 21 for setting the first to fourth reference voltages of the comparators 6 and 7. Moreover, the control circuit 4 generates an integrator output regulation signal 22 for instructing the integrator output regulator circuit 5 to regulate the output voltage of the integrator 2.

When the output voltage of the integrator 2 reaches High-1, the control circuit 4 generates, as the level control signal 21, a signal for resetting the reference voltage of the high-voltage-side comparator 6 to High-2. Moreover, when the output voltage of the integrator 2 reaches Low-1, the control circuit 4 generates, as the level control signal 21, a signal for resetting the reference voltage of the low-voltage-side comparator 7 to Low-2.

In addition, the control circuit 4 uses the comparison result of the window comparator 3, namely, the outputs of the comparators 6 and 7, to generate a digital signal and output a digital output Dout.

The integrator output regulator circuit 5 is provided between the input polarity switching unit 1 and the integrator 2, and regulates the output voltage of the integrator 2 based on the integrator output regulation signal 22 from the control circuit 4.

More specifically, when the output voltage of the integrator 2 reaches High-2, the integrator output regulator circuit 5 regulates the output voltage of the integrator 2 so that the output of the integrator 2 becomes Low-1. Moreover, when the output voltage of the integrator 2 reaches Low-2, the integrator output regulator circuit 5 regulates the output voltage of the integrator 2 so that the output of the integrator 2 becomes High-1.

Next, the operation of the analog-to-digital converter in accordance with the present embodiment will be described.

Figure 6:
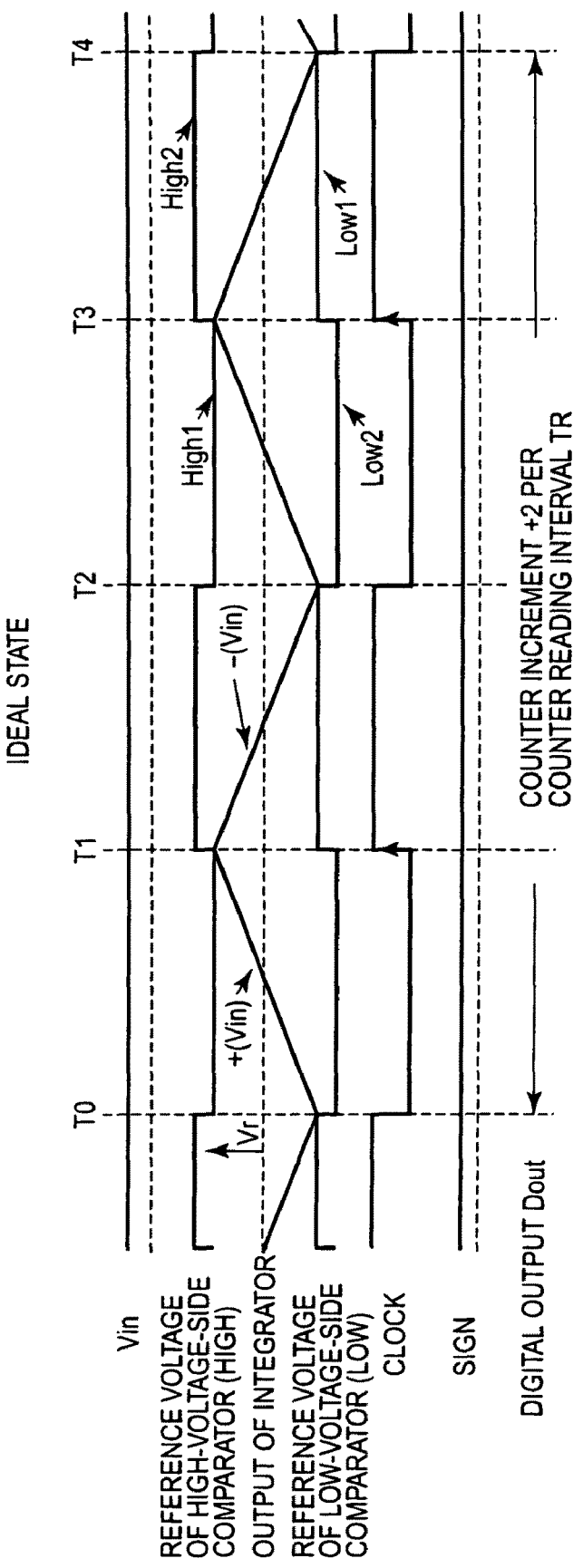
FIG. 6 illustrates operation waveforms (without offset and without dither) of the analog-to-digital converter in accordance with the embodiment.

(1) In the Case without Offset Va and without Dither (FIG. 6)

FIG. 6 illustrates operation waveforms in the case (ideal state) where the integrator 2 does not have an offset Va. At this time, dither Vd is not added. In FIG. 6, the input signal Vin is assumed to a constant value Vin from T0 to T4.

The reference voltage of the high-voltage-side comparator assumes two values High-1 and High-2 as illustrated in FIG. 6. Moreover, the reference voltage of the low-voltage-side comparator assumes two values Low-1 and Low-2 as illustrated in FIG. 6. The reference voltage of the high-voltage-side comparator and the reference voltage of the low-voltage-side comparator are switched in the following timing.

For example, as shown in the timing T0 of FIG. 6, when the output voltage of the integrator 2 reaches Low-1 of the low-voltage-side comparator, the reference voltage of the low-voltage-side comparator is switched from Low-1 to Low-2. In addition, in this timing, the high-voltage-side High-2 is switched to High-1.

Then as shown in the timing T1 of FIG. 6, when the output voltage of the integrator 2 reaches High-1 of the high-voltage-side comparator, the reference voltage of the high-voltage-side comparator is switched from High-1 to High-2. At the same time, the reference voltage of the low-voltage-side comparator is switched from Low-2 to Low-1.

In this manner, the reference voltages of the comparators 6 and 7 are switched in the timing when the output voltage of the integrator 2 reaches High-1 of the high-voltage-side comparator and Low-1 of the low-voltage-side comparator.

The clock is inverted when the output voltage of the integrator 2 reaches the reference voltage High-1 of the high-voltage-side comparator 6 or the reference voltage Low-1 of the low-voltage-side comparator 7. This clock is generated by the control circuit 4.

The sign is inverted when the output voltage of the integrator 2 reaches the reference voltage High-2 of the high-voltage-side comparator 6 or the reference voltage Low-2 of the low-voltage-side comparator. Note that since FIG. 6 illustrates an ideal state and the output voltage of the integrator 2 does not reach High-2 or Low-2, the sign is not changed.

The control circuit 4 includes a counter which counts +1 when the sign is in a plus state and the clock signal rises, and counts −1 when the sign is in a minus state and the clock signal rises. The digital output Dout outputs a signal based on the output of the counter.

Next, the operation of the operation waveforms from T0 to T4 illustrated in FIG. 6 will be described. First, in the timing of T0, the output voltage of the integrator becomes Low-1. At this time, the reference voltage of the low-voltage-side comparator is changed from Low-1 to Low-2, and the reference voltage of the high-voltage-side comparator is changed from High-2 to High-1. At this time, the clock signal falls. At the same time, the control circuit 4 outputs the polarity control signal 20 to the input polarity switching unit 1 so as to switch the polarity of the input signal Vin in the timing of T0. In this case, the input polarity switching unit 1 switches the polarity of the input signal.

In the timing of T1, the output voltage of the integrator becomes High-1. At this time, the reference voltage of the high-voltage-side comparator is changed from High-1 to High-2, and the reference voltage of the low-voltage-side comparator is changed from Low-2 to Low-1. At this time, the counter outputs +1 since the clock signal rises in the plus sign state. At the same time, the input polarity switching unit 1 switches the polarity of the input signal.

Hereinafter, the output voltage of the integrator repeatedly changes between High-1 and Low-1. At this time, the counter increment per counter reading interval tr, namely, the counter value from T1 to T4 is +2 (counts +1 at each of T1 and T3).

Figure 7:
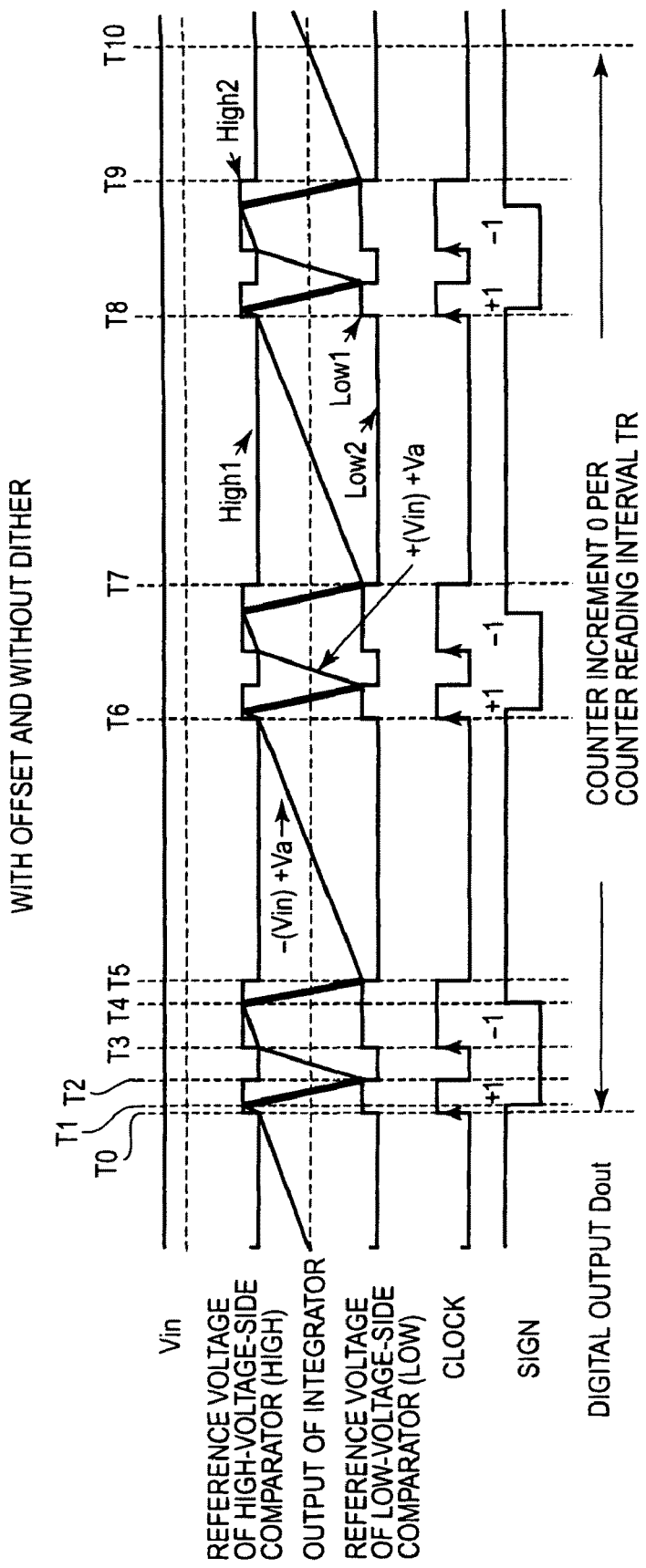
FIG. 7 illustrates operation waveforms (with offset and without dither) of the analog-to-digital converter in accordance with the embodiment.

(2) In the Case with Offset Va and without Dither (FIG. 7)

Next, by referring to FIG. 7, the description will focus on the case where the integrator 2 has the offset Va and the dither Vd is not added. Note that the basic operation of the input polarity switching unit 1, the integrator 2, the window comparator 3, and the control circuit 4 is the same as that described in FIG. 6.

In the case of FIG. 7, the input signal Vin is constant and the offset Va is present in the differential amplifier of the integrator. Therefore, the voltage inputted to the differential amplifier of the integrator has two kinds of voltages: Vin+Va or −Vin+Va. At this time, the absolute value |Vin| of the input signal is smaller than the absolute value |Va| of the offset. In addition, in the initial state, the polarity of the input polarity switching unit is negative. Assuming that the voltage of one side of the differential amplifier 8 is 0V, current [−(Vin)+Va]/R flows into the resistor 10. At this time, the output of the integrator is assumed to be in a voltage rising state.

In the timing of T0, the output voltage of the integrator becomes High-1. At this time, the reference voltage of the high-voltage-side comparator is changed from High-1 to High-2, and the reference voltage of the low-voltage-side comparator is changed from Low-2 to Low-1. At this time, the counter outputs +1 since the clock signal rises in the plus sign state. At the same time, the input polarity switching unit 1 switches the polarity of the input signal. That is, in the interval from T0 to T1, an input signal of +Vin+Va is inputted to the integrator. However, since |Vin|<|Va|, the direction of the current flowing to the resistor 10 is unchanged, and the output voltage of the integrator continues to rise.

In the timing of T1, when the output voltage of the integrator reaches High-2, the control circuit 4 outputs the integrator output regulation signal 22 to the integrator output regulator circuit 5 to regulate the input signal level so that the output voltage of the integrator becomes Low-1. Specifically, the integrator output regulator circuit 5 accumulates charges in the capacitor 9 of the integrator 2. As the charges are accumulated in the capacitor 9, the output voltage of the differential amplifier 8 is falling. In this manner, the output voltage of the integrator 2 is guided to the vicinity of Low-1. In the timing of T1, the output voltage of the integrator reaches High-2, and thus the control circuit inverts the sign from plus to minus.

In the timing of T2, when the output voltage of the integrator reaches Low-1, the control circuit 4 switches the reference voltage of the high-voltage-side comparator from High-2 to High-1, and switches the reference voltage of the low-voltage-side comparator from Low-1 to Low-2. At this time, the clock signal falls. Note that if the output voltage of the integrator has reached Low-1 by the regulation of the integrator output regulator circuit 5, the input polarity switching unit 1 does not switch the polarity of the input signal. Consequently, in the interval from T2 to T3, an input signal of +Vin+Va is inputted to the integrator.

Then, in the timing of T3, the output voltage of the integrator becomes High-1. At this time, the reference voltage of the high-voltage-side comparator is changed from High-1 to High-2, and the reference voltage of the low-voltage-side comparator is changed from Low-2 to Low-1. At this time, the counter outputs −1 since the clock signal rises in the minus sign state. At the same time, the input polarity switching unit 1 switches the polarity of the input signal. Thereby, in the interval from T3 to T4, an input signal of −Vin+Va is inputted to the integrator.

Then, in the timing of T4, when the output voltage of the integrator reaches High-2, the control circuit 4 outputs the integrator output regulation signal 22 to the integrator output regulator circuit 5 to regulate the input signal level so that the output voltage of the integrator becomes Low-1. That is, the output voltage of the integrator 2 is guided to the vicinity of Low-1. In the timing of T4, the output voltage of the integrator reaches High-2, and thus the control circuit inverts the sign from minus to plus.

Then, in the timing of T5, when the output voltage of the integrator reaches Low-1, the control circuit 4 switches the reference voltage of the high-voltage-side comparator from High-2 to High-1, and switches the reference voltage of the low-voltage-side comparator from Low-1 to Low-2. At this time, the clock signal falls. Note that if the output voltage of the integrator has reached Low-1 by the regulation of the integrator output regulator circuit 5, the input polarity switching unit 1 does not switch the polarity of the input signal. Consequently, in the interval from T5 to T6, an input signal of −Vin+Va is inputted to the integrator.

Hereinafter, the operation from T6 to T10 is the same as that from T0 to T6 as described above. The counter increment per counter reading interval tr, namely, the counter increment from T0 to T10 is 0, i.e., unchanged. In other words, while the analog-to-digital converter continues operating as illustrated in FIG. 7, the counter value does not increase and the analog-to-digital conversion result remains zero. For this reason, if the absolute value of the offset voltage Va is larger than the absolute value of the input signal (|Vin|<|Va|), the analog-to-digital converter has a dead band region.

Figure 8:
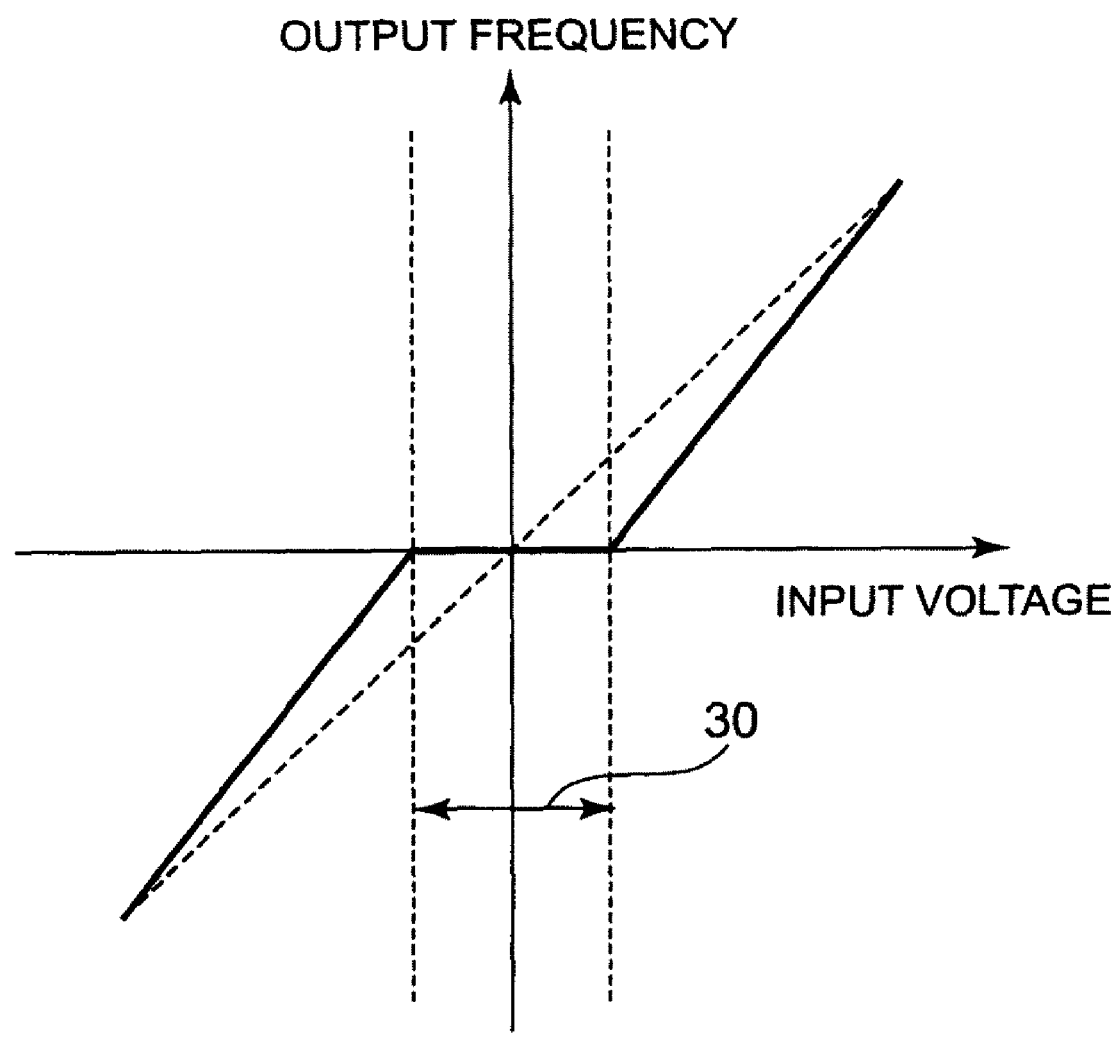
FIG. 8 illustrates the relationship between an input voltage and an output frequency of the analog-to-digital converter in accordance with the embodiment. The dotted line denotes the case without offset, and the solid line denotes the case with offset.

FIG. 8 explains the dead band region of the analog-to-digital converter. In FIG. 8, the dotted line denotes the relationship between an input voltage and an output frequency of the analog-to-digital converter in an ideal state (without offset). In this case, the output signal can be obtained even in a region with a small input voltage. In addition, the solid line denotes the relationship between the input voltage and the output frequency when the integrator has an offset Va. In this case, the output signal cannot be obtained in a region with a small input voltage. That is, the dead band region 30 is present.

According to the present embodiment, dither is added to the input signal in order to eliminate the aforementioned dead band region. Hereinafter, the operation of the analog-to-digital converter in the case with dither added will be described.

Figure 2:
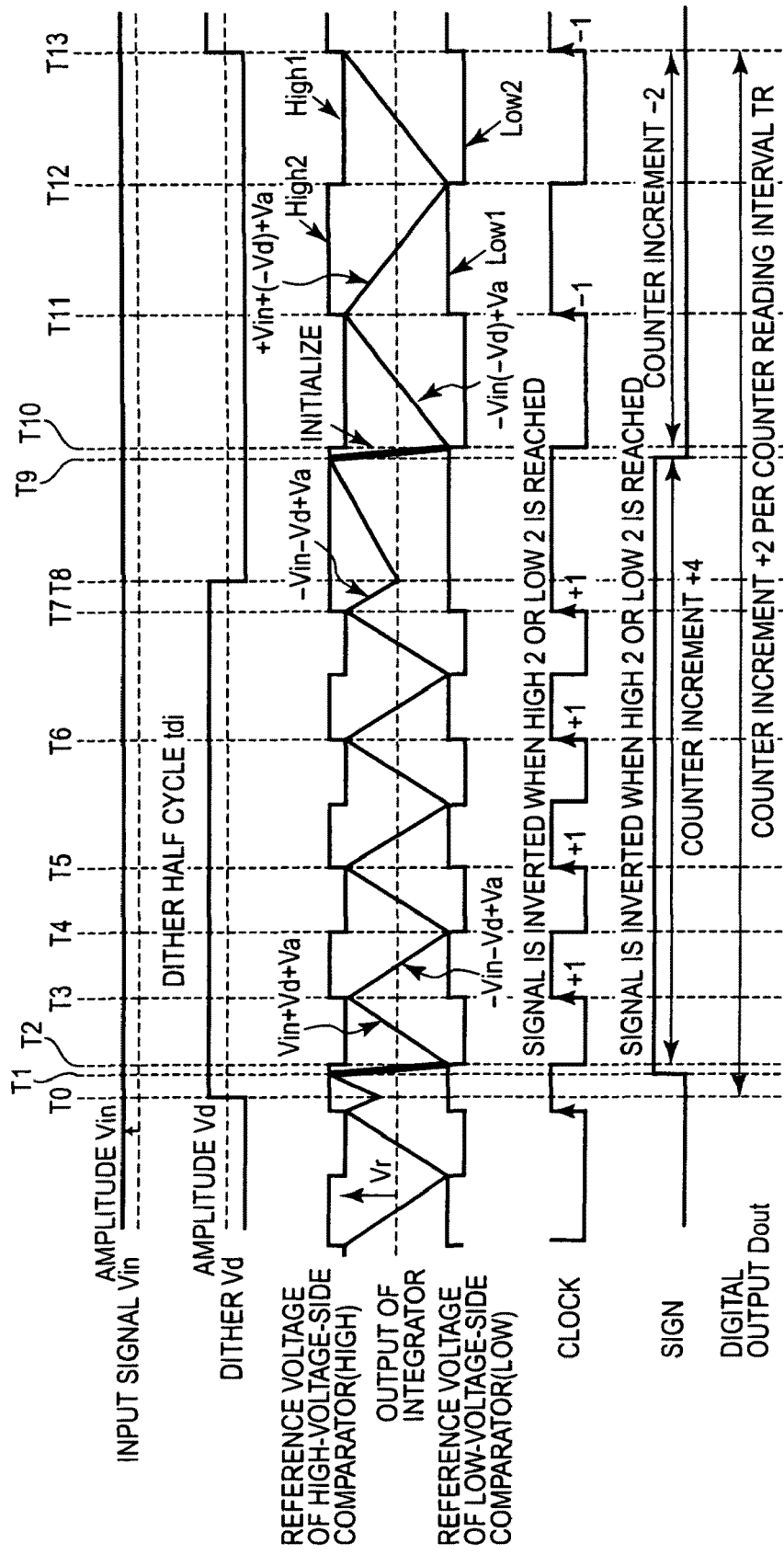
FIG. 2 illustrates operation waveforms (with offset and with dither) of the analog-to-digital converter in accordance with the embodiment.

(3) In the Case with Offset Va and with Dither (FIG. 2)

Next, by referring to FIG. 2, the description will focus on the case where the integrator has the offset Va and the dither Vd is added. Note that the basic operation of the input polarity switching unit 1, the integrator 2, the window comparator 3, and the control circuit 4 is the same as that described above.

In the case of the operation waveforms of FIG. 2, the input signal Vin is also constant. Moreover, the dither generation circuit 11 generates dither Vd and adds the dither Vd to the input signal Vin. The offset Va is present in the differential amplifier of the integrator. Therefore, when the dither is plus (from T0 to T8), the value of the dither is +Vd, and the voltage inputted to the differential amplifier of the integrator has two kinds of voltages: Vin+Vd+Va or −Vin−Vd+Va. In contrast, when the dither is minus (from T8 to T13), the value of the dither is −Vd. Therefore, the voltage inputted to the differential amplifier of the integrator has two kinds of voltages: Vin−Vd+Va or −Vin+Vd+Va. At this time, the absolute value |Vin| of the input signal is smaller than the absolute value |Va| of the offset. Note that Vd is assumed to be the absolute value of dither amplitude.

Here, the dither Vd is assumed to be such that a cycle (from T0 to T13) in which a digital signal is read, namely, the counter reading interval tr, is an integral multiple of a dither cycle. Further, the dither Vd is assumed to be such that the amplitude value of the dither is larger than each of the offset value Va of the integrator 2 and the amplitude value Vin of the input signal. Moreover, the dither is assumed to be generated in such a manner that the number of times the count value is generated in the first half (i.e., from T0 to T8) of one cycle of the dither is different from the number of times the count value is generated in the second half thereof (i.e., T8 to T13).

Next, by referring to FIG. 2, the operation of the analog-to-digital converter in the case with dither added will be described.

First, in the timing of T0, the dither Vd is added to the input signal Vin. In this timing, the output voltage of the integrator starts to increase. Then, in the timing of T1, when the output voltage of the integrator reaches High-2, the control circuit 4 outputs the integrator output regulation signal 22 to the integrator output regulator circuit 5 to regulate the input signal level so that the output voltage of the integrator becomes Low-1. Specifically, the integrator output regulator circuit 5 accumulates charges in the capacitor 9 of the integrator 2. As the charges are accumulated in the capacitor 9, the output voltage of the differential amplifier 8 is falling. In this manner, the output voltage of the integrator 2 is guided to the vicinity of Low-1. In the timing of T1, the output voltage of the integrator reaches High-2, and thus the control circuit inverts the sign from minus to plus.

In the timing of T2, when the output voltage of the integrator reaches Low-1, the control circuit 4 switches the reference voltage of the high-voltage-side comparator from High-2 to High-1, and switches the reference voltage of the low-voltage-side comparator from Low-1 to Low-2. At this time, the clock signal falls. Note that if the output voltage of the integrator has reached Low-1 by the regulation of the integrator output regulator circuit 5, the input polarity switching unit 1 does not switch the polarity of the input signal. Consequently, in the interval from T2 to T3, an input signal with the dither of Vin+Vd+Va is inputted to the integrator.

Then, in the timing of T3, the output voltage of the integrator becomes High-1. At this time, the reference voltage of the high-voltage-side comparator is changed from High-1 to High-2, and the reference voltage of the low-voltage-side comparator is changed from Low-2 to Low-1. At this time, the counter outputs +1 since the clock signal rises in the plus sign state. At the same time, the input polarity switching unit 1 switches the polarity of the input signal. Thereby, in the interval from T3 to T4, an input signal with the dither of −Vin−Vd+Va is inputted to the integrator.

Then, in the timing of T4, when the output voltage of the integrator reaches Low-1, the control circuit 4 switches the reference voltage of the high-voltage-side comparator from High-2 to High-1, and switches the reference voltage of the low-voltage-side comparator from Low-1 to Low-2. At this time, the clock signal falls. At the same time, the control circuit 4 outputs the polarity control signal 20 to the input polarity switching unit 1 so as to switch the polarity of the input signal in the timing of T4. When the polarity control signal 20 is inputted, the input polarity switching unit 1 switches the polarity of the input signal. Thereby, in the interval from T4 to T5, an input signal with the dither of Vin+Vd+Va is inputted to the integrator. Hereinafter, the same operation is repeated until T8.

When the dither Vd becomes minus in the timing of T8, the output voltage of the integrator starts to increase. That is, in the interval from T8 to T9, an input signal with the dither of −Vin−(−Vd)+Va is inputted to the integrator. Then, in the timing of T9, when the output voltage of the integrator reaches High-2, the control circuit 4 outputs the integrator output regulation signal 22 to the integrator output regulator circuit 5 to regulate the input signal level so that the output voltage of the integrator becomes Low-1. That is, the output voltage of the integrator 2 is guided to the vicinity of Low-1.

In the timing of T9, the output voltage of the integrator reaches High-2, and thus the control circuit inverts the sign from plus to minus.

Then, in the timing of T10, when the output voltage of the integrator reaches Low-1, the control circuit 4 switches the reference voltage of the high-voltage-side comparator from High-2 to High-1, and switches the reference voltage of the low-voltage-side comparator from Low-1 to Low-2. At this time, the clock signal falls. Note that if the output voltage of the integrator has reached Low-1 by the regulation of the integrator output regulator circuit 5, the input polarity switching unit 1 does not switch the polarity of the input signal. Consequently, in the interval from T10 to T11, an input signal with the dither of −Vin−(−Vd)+Va is inputted to the integrator.

Then, in the timing of T11, the output voltage of the integrator becomes High-1. At this time, the reference voltage of the high-voltage-side comparator is changed from High-1 to High-2, and the reference voltage of the low-voltage-side comparator is changed from Low-2 to Low-1. At this time, the counter outputs −1 since the clock signal rises in the minus sign state. At the same time, the input polarity switching unit 1 switches the polarity of the input signal. Thereby, in the interval from T11 to T12, an input signal with the dither of +Vin+(−Vd)+Va is inputted to the integrator. Hereinafter, the same operation is repeated until T13.

In the above described operation of FIG. 2, the counter increment at the time of the plus sign state is +4, the counter increment at the time of the minus sign state is −2, and the counter increment per counter reading interval tr (from T0 to T13) is +2. Consequently, the value of the digital output Dout can be obtained and the dead band region can be eliminated by adding dither.

More specifically, the count value can be obtained for each dither cycle by generating dither in such a manner that the number of times the count value is generated in the first half of one cycle of the dither is different from the number of times the count value is generated in the second half of the one cycle of the dither. This method can eliminate the dead band region, thereby enabling to improve the accuracy of the analog-to-digital converter. In the above example, the count value is generated four times in the first half cycle and the count value is generated two times in the second half cycle.

Alternatively, the count value can be obtained for each dither cycle by generating dither in such a manner that the sum of the count value obtained in the first half of one cycle of the dither and the count value obtained in the second half of the one cycle of the dither is equal to or greater than 1. This method can eliminate the dead band region, thereby enabling to improve the accuracy of the analog-to-digital converter. In the above example, the count value obtained in the first half cycle is +4, and the count value obtained in the second half cycle is −2. Consequently, the sum of these count values is +2 (i.e., a value of 1 or more).

Next, the principle of the operation waveforms in the above cases from (1) to (3) will be described.

Each of td1, td2, td3, and td4 is assumed to be a time until reaching the comparator level when the dither amplitude is positive and negative. Then, the basic equation for a transfer function can be expressed as in the following expressions 1-1 to 1-4.

$Vd > 0 \quad Vd1 = Vd$ $$\begin{cases} \dfrac{+\int_0^{td1} \dfrac{+(Vin+Vd1)-Va}{R}\,dt}{C} = 2Vr \\ \dfrac{-\int_0^{td2} \dfrac{-(Vin+Vd1)-Va}{R}\,dt}{C} = 2Vr \end{cases} \quad \begin{cases} \dfrac{(Vin+Vd1)-Va}{RC}td1 = 2Vr & \text{Expression 1-1} \\ \dfrac{(Vin+Vd1)+Va}{RC}td2 = 2Vr & \text{Expression 1-2} \end{cases}$$

$Vd < 0 \quad Vd2 = -Vd$ $$\begin{cases} \dfrac{+\int_0^{td3} \dfrac{+(Vin+Vd2)-Va}{R}\,dt}{C} = 2Vr \\ \dfrac{-\int_0^{td4} \dfrac{-(Vin+Vd2)-Va}{R}\,dt}{C} = 2Vr \end{cases} \quad \begin{cases} \dfrac{-(Vin+Vd2)-Va}{RC}td3 = 2Vr & \text{Expression 1-3} \\ \dfrac{-(Vin+Vd2)+Va}{RC}td4 = 2Vr & \text{Expression 1-4} \end{cases}$$

Here, Vin denotes an input signal voltage, Va denotes an offset voltage of the input terminal of the differential amplifier, 2Vr denotes a voltage (difference between High-1 and Low-1) between the high-voltage and low-voltage comparator levels, R denotes an input resistance, and C denotes an integrator capacitor value. In addition, tr denotes a counter output reading interval.

From the above expressions, the digital output (counter output) Dout can be expressed in the following expression. Note that the Dout outputs a positive value and the signal polarity is detected separately.

$$Dout = \dfrac{tr \cdot Vin}{4Vr \cdot RC}\left\{1 - \dfrac{Va^2}{Vin^2 - Vd^2}\right\}$$

-continued $$\text{Error term } \dfrac{Va^2}{Vin^2 - Vd^2}$$

Based on the above expressions, the description will focus on (1) a case without offset Va and without dither, (2) a case with offset Va and without dither, and (3) a case with offset Va and with dither.

(1) A Case without Offset Va and without Dither

First, the description will focus on (1) a case without offset Va and without dither. In the case of offset Va=0 (ideal state), the above expressions 1-1 to 1-4 are used to obtain the expressions 2-1 to 2-4. Then, the following digital output (counter output) Dout can be obtained.

$Vin \geq 0 \quad (Va = 0)$ $$\begin{cases} \dfrac{\int_0^{t1+} \dfrac{(Vin+0)-Va}{R}\,dt}{C} = +2Vr \\ \dfrac{\int_0^{t2-} \dfrac{(Vin+0)-Va}{R}\,dt}{C} = -2Vr \end{cases} \quad \begin{cases} \dfrac{(Vin+0)-0}{RC}t1 = 2Vr & \text{Expression 2-1} \\ \dfrac{(Vin+0)+0}{RC}t2 = 2Vr & \text{Expression 2-2} \end{cases}$$

$$Dout = \dfrac{tr}{t1+t2} = \dfrac{tr}{4Vr \cdot RC}Vin$$

$Vin < 0 \quad (Va = 0)$ $$\begin{cases} \dfrac{\int_0^{t3-} \dfrac{(Vin+0)-Va}{R}\,dt}{C} = +2Vr \\ \dfrac{\int_0^{t4+} \dfrac{(Vin+0)-Va}{R}\,dt}{C} = -2Vr \end{cases} \quad \begin{cases} \dfrac{-(Vin+0)-0}{RC}t3 = 2Vr & \text{Expression 2-3} \\ \dfrac{-(Vin+0)+0}{RC}t4 = 2Vr & \text{Expression 2-4} \end{cases}$$

$$Dout = \dfrac{tr}{t3+t4} = (-1) \cdot \dfrac{tr}{4Vr \cdot RC}Vin$$

Here, each of t1, t2, t3, t4 is a time until the integration result reaches 2Vr. Assuming Vin=input full range÷VF converted maximum frequency×expected frequency=50 mV÷2500 Hz×13 Hz, Vr=0.5 V, R=100 kΩ, C=100 pF, and tr=1 sec, the expected value of the counter output Dout is as follows.

$$Dout = \frac{tr}{4Vr \cdot RC}Vin = \frac{1 \text{ sec}}{4 \cdot 0.5 \text{ V} \cdot 100 \text{ k}\Omega \cdot 100 \text{ pF}} \cdot \frac{50 \text{ mV}}{2500 \text{ Hz}} 13 \text{ Hz} = 13 \text{(Expected value)}$$

Figure 9:
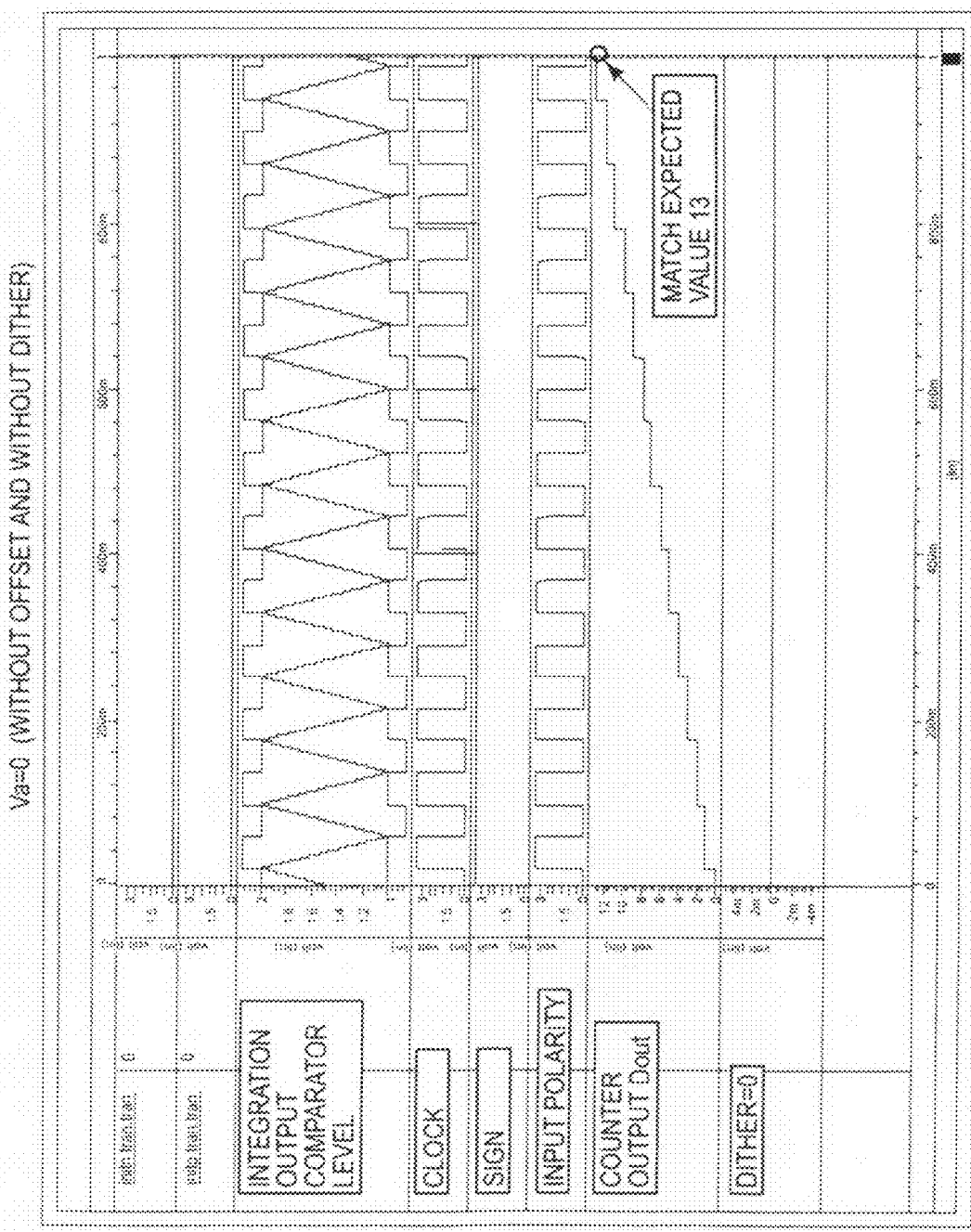
FIG. 9 illustrates a simulation result (without offset and without dither) of the analog-to-digital converter in accordance with the embodiment.

A simulation result of this case is illustrated in FIG. 9. It is understood from this result that the counter output Dout matches the expected value 13 obtained from the above expression.

(2) A Case with Offset Va and without Dither

Next, the description will focus on (2) a case with offset Va and without dither. The counter output Dout without dither in the case of offset Va≈0 can be obtained using the following expressions 3-1 to 3-4.

$Vin \geq 0 \ (Va \neq 0)$ $$\begin{cases} \dfrac{\int_0^{t1+} \dfrac{(Vin+0)-Va}{R} \cdot dt}{C} = +2Vr \\ \dfrac{\int_0^{t2-} \dfrac{(Vin+0)-Va}{R} \cdot dt}{C} = -2Vr \end{cases} \quad \begin{cases} \dfrac{(Vin+0)-Va}{RC}t1 = 2Vr \quad \text{Expression 3-1} \\ \dfrac{(Vin+0)+Va}{RC}t2 = 2Vr \quad \text{Expression 3-2} \end{cases}$$

$$Dout = \frac{tr}{t1+t2} = \frac{tr}{4Vr \cdot RC}Vin\left(1 - \frac{Va^2}{Vin^2}\right)$$

$Vin < 0 \ (Va \neq 0)$ $$\begin{cases} \dfrac{+\int_0^{t3-} \dfrac{(Vin+0)-Va}{R} \cdot dt}{C} = +2Vr \\ \dfrac{+\int_0^{t4+} \dfrac{(Vin+0)-Va}{R} \cdot dt}{C} = -2Vr \end{cases} \quad \begin{cases} \dfrac{-(Vin+0)-Va}{RC}t3 = 2Vr \quad \text{Expression 3-3} \\ \dfrac{-(Vin+0)+Va}{RC}t4 = 2Vr \quad \text{Expression 4-4} \end{cases}$$

$$Dout = \frac{tr}{t3+t4} = (-1) \cdot \frac{tr}{4Vr \cdot RC}Vin\left(1 - \frac{Va^2}{Vin^2}\right)$$

From the above expressions, the relationship between the value of Va and Dout is as follows.

Figure 10:
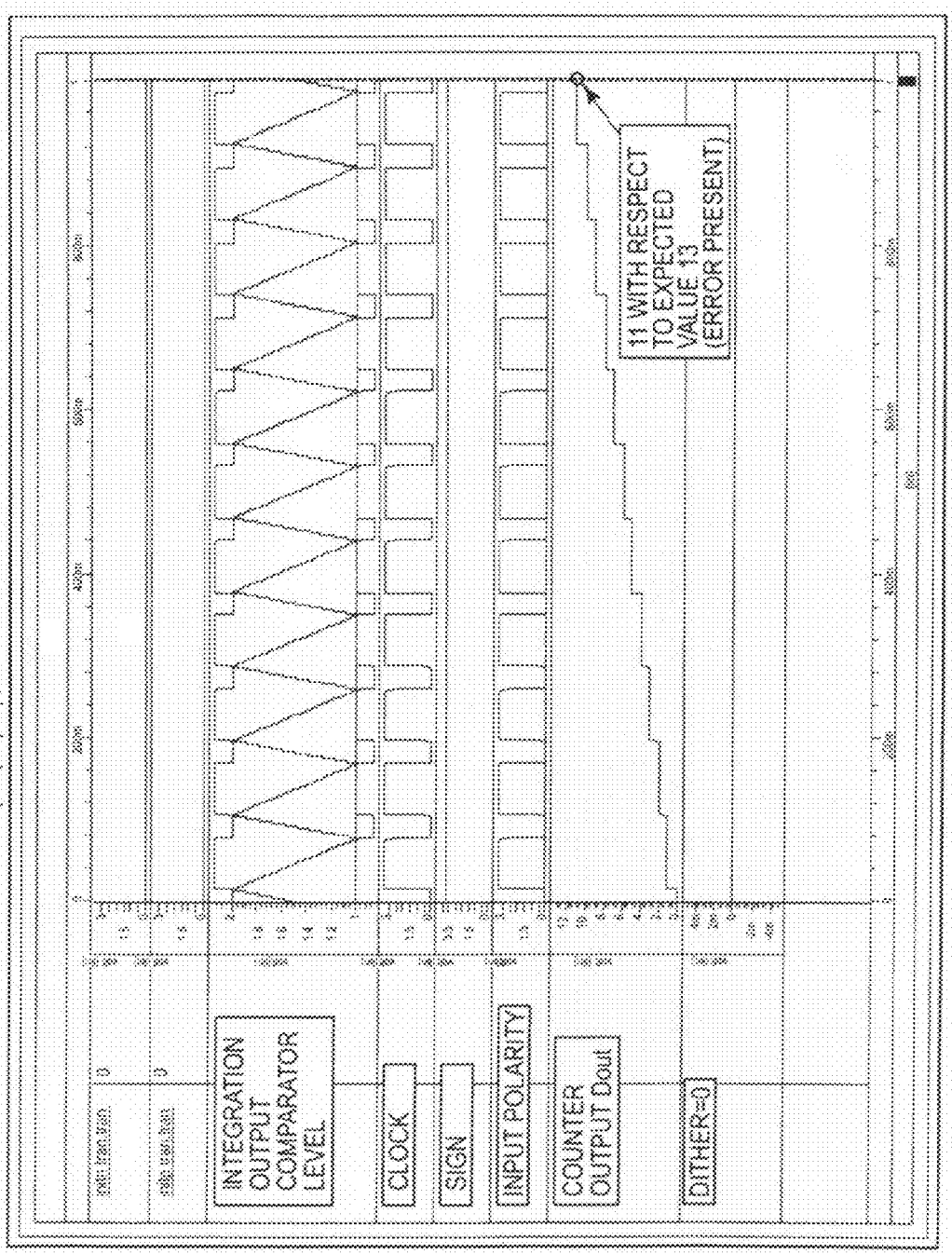
FIG. 10 illustrates a simulation result (|Vin|>|Va|, without dither) of the analog-to-digital converter in accordance with the embodiment.

(A) In the case of |Vin|>|Va|, Dout is affected by $-Va^2/Vin^2$ as an error. A simulation result of this case is illustrated in FIG. 10. In FIG. 10, the counter output Dout is 11 with respect to an expected value of 13, i.e., an error occurs.

Figure 11:
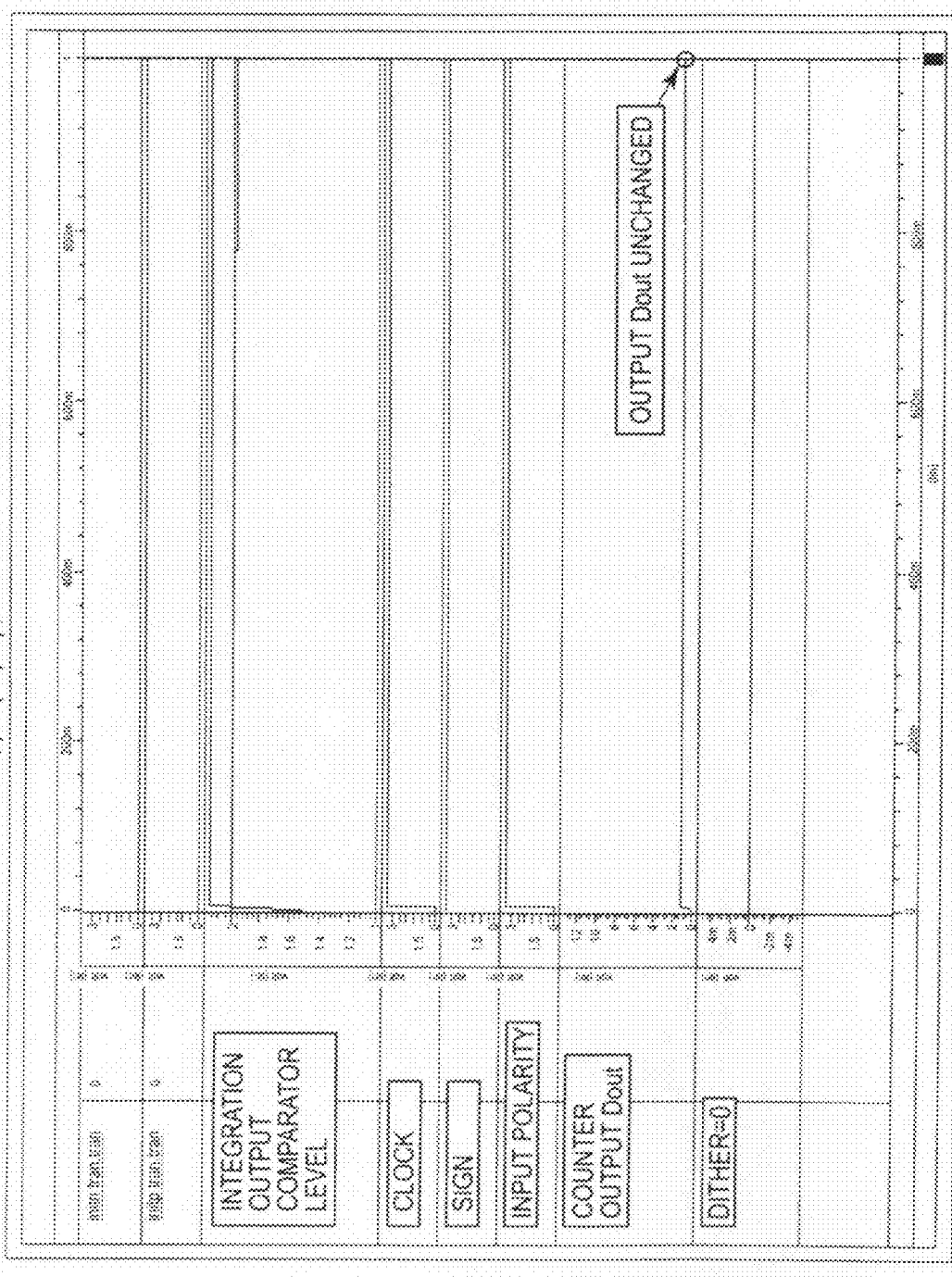
FIG. 11 illustrates a simulation result (Va≠0, |Vin|=|Va|, without dither) of the analog-to-digital converter in accordance with the embodiment.

(B) In the case of Vin=Va, there is a state like as no signal with Dout=0. That is, t1 or t4 becomes infinite. A simulation result of this case is illustrated in FIG. 11. In FIG. 11, the counter output Dout is not changed.

(C) In the case of Vin=−Va, there is a state like as no signal with Dout=0. That is, t2 or t3 becomes infinite. A simulation result of this case is illustrated in FIG. 11. In FIG. 11, the counter output Dout is not changed.

Figure 12:
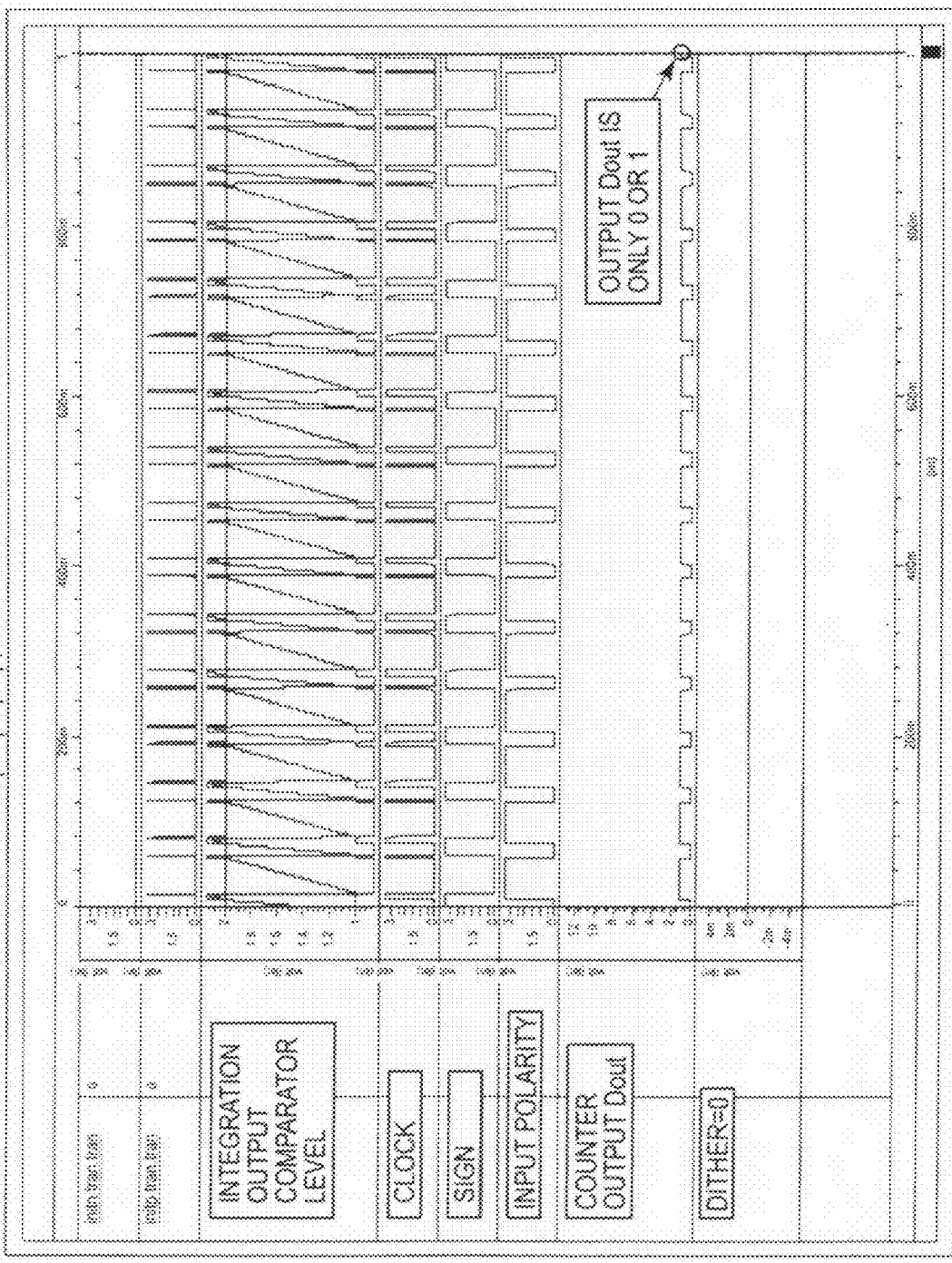
FIG. 12 illustrates a simulation result (Va≠0, |Vin|<|Va|, without dither) of the analog-to-digital converter in accordance with the embodiment.
Figure 13:
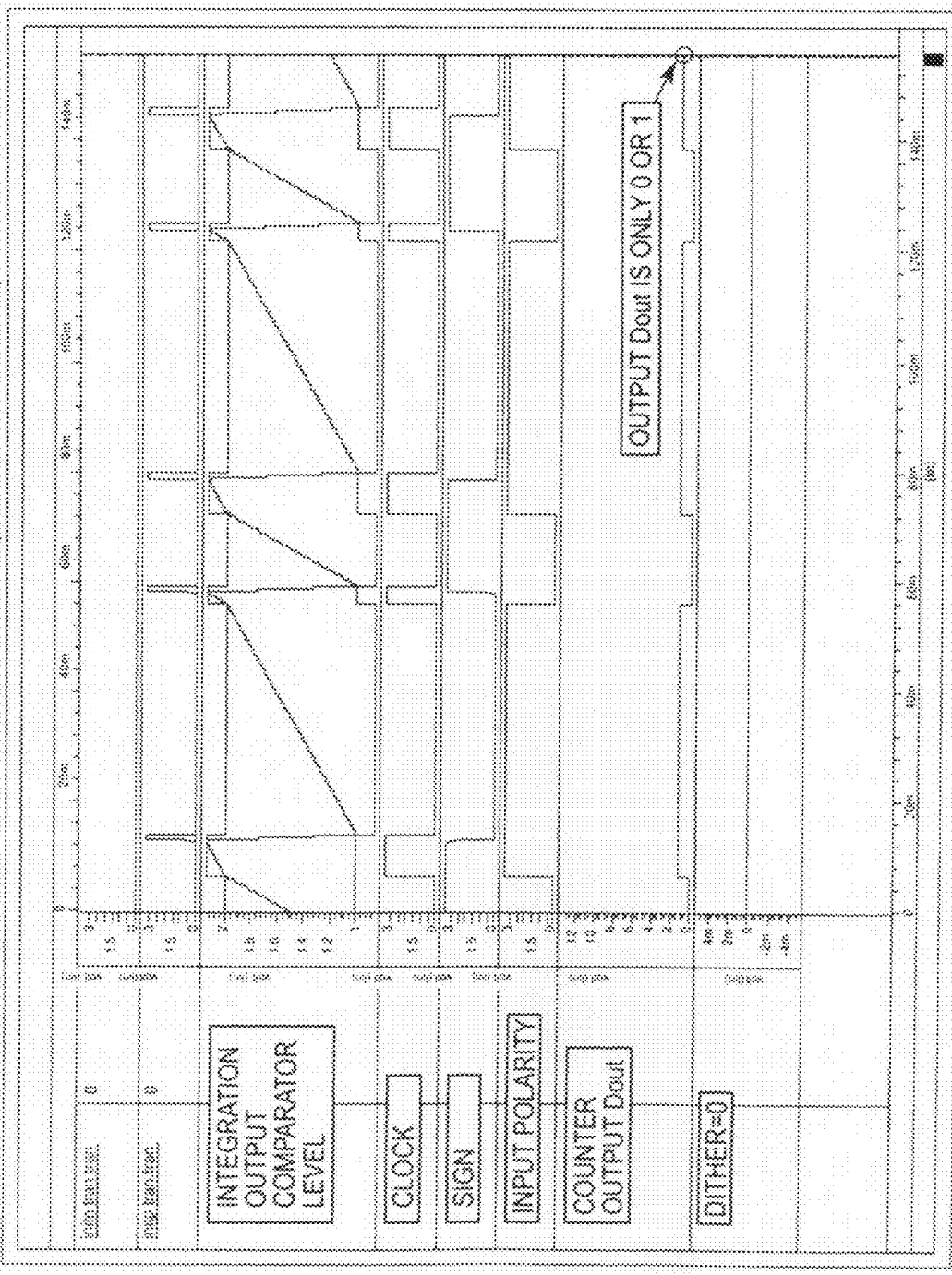
FIG. 13 illustrates a simulation result (Va≠0, |Vin|<|Va|, without dither, expanded time axis of FIG. 12) of the analog-to-digital converter in accordance with the embodiment.

(D) In the case of |Vin|<|Va|, there is no real solution and divergent. That is, the sign do not match between the right-hand side and the left-hand side of the simultaneous equation. However, the real circuit is initialized by the integrator output regulator circuit to be equivalent to no signal state. A simulation result of this case is illustrated in FIGS. 12 and 13. FIG. 13 expands the time axis of FIG. 12. In FIGS. 12 and 13, the counter output Dout is only 0 or 1.

It is understood from the above result that in the case of |Vin|≦|Va|, an input signal cannot be detected and a dead band region occurs in the AD conversion characteristic.

(3) A Case with Offset Va and with Dither

Next, the description will focus on (3) a case with offset Va (Va≈0) and with dither. In this case, dither to be added to detect an input signal Vin is set to an alternating-current in order to separate from a direct-current signal component (Vin). In addition, the dither frequency is set in such a manner that an integer number of dither waves are contained in the counter output reading interval tr, and the dither frequency is lower than the V-F converted frequency by the input signal Vin. Further, the dither amplitude Vd is set in such a manner that the output of the integrator exceeds the range of the high-voltage-side and low-voltage-side comparators and the Dout has an error of less than 1. For this reason, Vd is set to a voltage equal to or greater than the input signal amplitude Vin.

That is, the dither frequency is set in such a manner that an integer number of dither waves are contained in the counter output reading interval tr. This method can zero the dither energy after integration and can eliminate the dither component. Further, the dither frequency is set to be lower than the V-F converted frequency (an expected value in an ideal state) by the input signal Vin. The integrator 2 is initialized every half dither cycle by the integrator output regulator circuit 5. Therefore, the counter value (integer) is obtained every half dither cycle; and an effective component of the input signal is extracted in the next half dither cycle. Here, if the dither frequency is higher than the input signal frequency, the counter value within one dither cycle becomes less than 1, and thus cannot be correctly detected. For example, if the ideal counter increment per counter reading interval tr is +2 and dither has 10 waves, the relationship between the signal and dither for each dither cycle is equal with respect to each of the 10 waves of dither. Thus, the counter increment per dither wave needs to be +0.2. However, the counter is an integer value, and thus a correct solution cannot be obtained.

The dither amplitude Vd needs to reach the comparator level within a dither half cycle tdi and update the counter value. Consequently, the necessary condition for the dither amplitude Vd is as follows.

$$\frac{\int_0^{tdi} \frac{Vd - Vin - Va}{R} \cdot dt}{C} \geq N \cdot 2Vr$$

$$(Vd - Vin - Va)tdi \geq RC \cdot N \cdot 2Vr$$

$$\therefore Vd \geq \frac{RC}{tdi} \cdot N \cdot 2Vr + (Vin + Va)$$

Here, N denotes the number of times the integration result reaches the comparator level within tdi (i.e., the number of times the output voltage of the integrator reaches from the first reference voltage to the third reference voltage or from the third reference voltage to the first reference voltage). If there is no loss, N can be set to 1. It is understood from this expression that Vd is required to satisfy Vd≧RC/tdi*N*2Vr*(Vin+Va).

Moreover, the necessary condition for the dither amplitude obtained from the transfer function are as in the expressions 4-1 to 4-4. Here, a time until reaching the comparator level each when the dither amplitude is positive and negative is assumed to be td1, td2, td3, and td4.

$Vd > 0 \quad Vd1 = Vd$ $$\begin{cases} \dfrac{+\int_0^{td1} \frac{+(Vin+Vd1)-Va}{R} \cdot dt}{C} = 2Vr \\ \dfrac{-\int_0^{td2} \frac{-(Vin+Vd1)-Va}{R} \cdot dt}{C} = 2Vr \end{cases}$$

$$\begin{cases} \dfrac{(Vin+Vd1)-Va}{RC} td1 = 2Vr \quad \text{Expression 4-1} \\ \dfrac{(Vin+Vd1)+Va}{RC} td2 = 2Vr \quad \text{Expression 4-2} \end{cases}$$

$Vd < 0 \quad Vd2 = -Vd$ $$\begin{cases} \dfrac{+\int_0^{td3} \frac{+(Vin+Vd2)-Va}{R} \cdot dt}{C} = 2Vr \\ \dfrac{-\int_0^{td4} \frac{-(Vin+Vd2)-Va}{R} \cdot dt}{C} = 2Vr \end{cases}$$

$$\begin{cases} \dfrac{-(Vin+Vd2)-Va}{RC} td3 = 2Vr \quad \text{Expression 4-3} \\ \dfrac{-(Vin+Vd2)+Va}{RC} td4 = 2Vr \quad \text{Expression 4-4} \end{cases}$$

From this expression, the number of times D1 and D2 until reaching the comparator level in the half dither cycle tdi each when the dither amplitude is positive and negative are as follows.

$$D1 = \frac{tdi}{td1 + td2} \quad D2 = \frac{tdi}{td3 + td4}$$

Consequently, when one wave of dither is contained in the counter output reading interval tr, the counter value Dout is as follows.

$$Dout = D1 - D2 = \frac{tdi}{td1+td2} - \frac{tdi}{td3+td4} =$$

$$\frac{tdi \cdot Vin \cdot (Va^2 + Vd^2 - Vin^2)}{2Vr \cdot RC \cdot (Vd^2 - Vin^2)} = \frac{tdi \cdot Vin \cdot (Vd^2 - Vin^2)}{2Vr \cdot RC \cdot (Vd^2 - Vin^2)} +$$

$$\frac{tdi \cdot Vin \cdot (Va^2)}{2Vr \cdot RC \cdot (Vd^2 - Vin^2)} = \frac{tdi \cdot Vin}{2Vr \cdot RC}\left\{1 + \frac{(Va^2)}{(Vd^2 - Vin^2)}\right\} =$$

$$\frac{tr \cdot Vin}{4Vr \cdot RC}\left\{1 - \frac{Va^2}{Vin^2 - Vd^2}\right\}$$

In the above expression, the circuit is designed in such a manner that a minus sign is added in front of D2.

Here, assuming Vd>>√(Vin²+Va²) (Vd is a voltage equal to or greater than the input signal Vin), the error term becomes a positive value of −(Va²)/(Vin²−Vd²)<<1. If Dout has an error of less than 1, the error term can be ignored with respect to an integer value which Dout can assume. Thereby, under |Vin|≦|Va|, Dout can be the same value as the count value Dout in the ideal state without dither.

For example, assuming Va=0.5 mV, Vin=50 mV÷2500 Hz×13 Hz=260 µV, Vd=5 mV, 1−(Va²)/(Vin²−Vd²)=1.01 is obtained. Assuming that expected value 13×error coefficient 1.01=13.13 as an integer 13 which Dout can assume, Dout matches the expected value.

Figure 14:
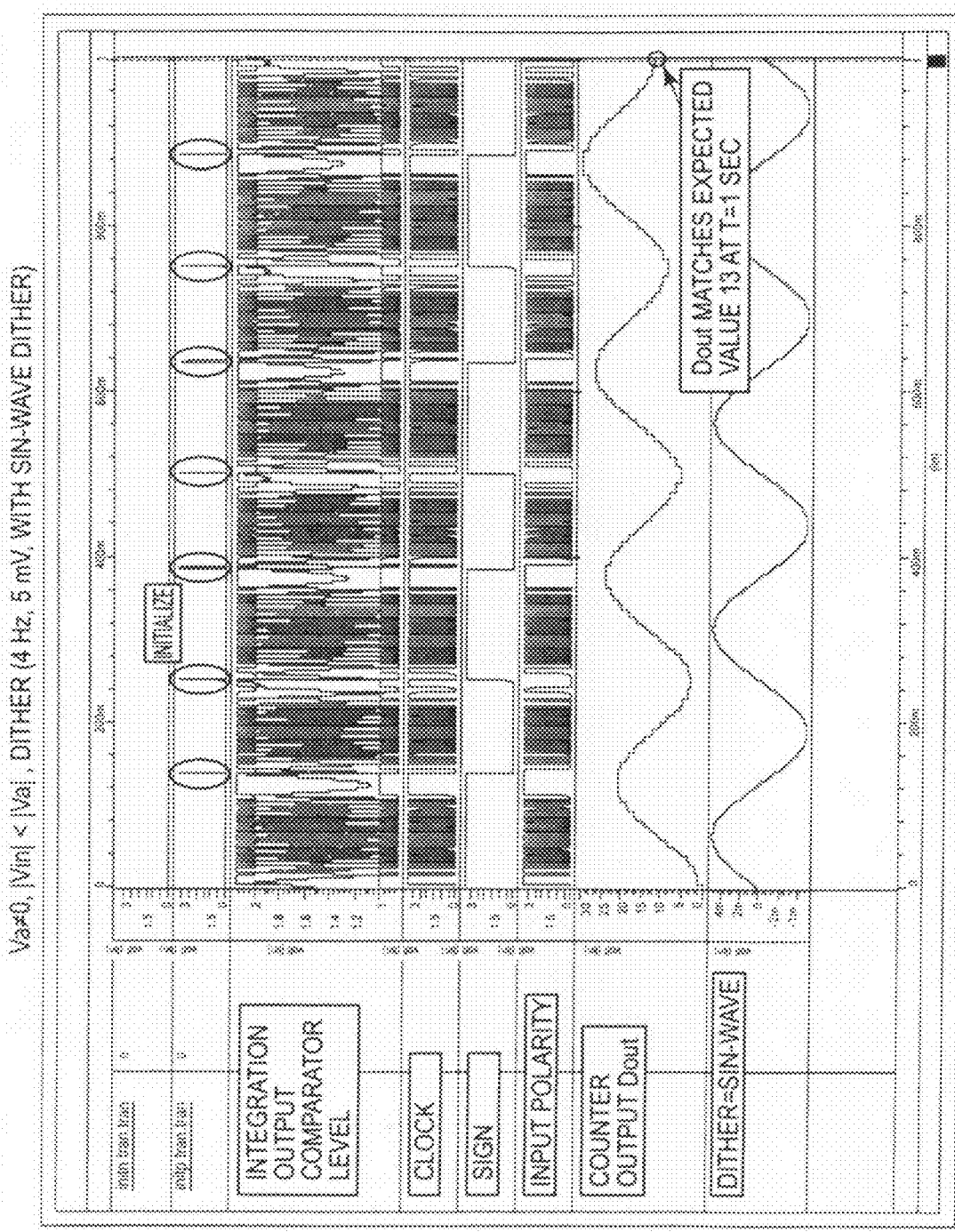
FIG. 14 illustrates a simulation result (Va≠0, |Vin|<|Va|, with sin-wave dither) of the analog-to-digital converter in accordance with the embodiment.
Figure 15:
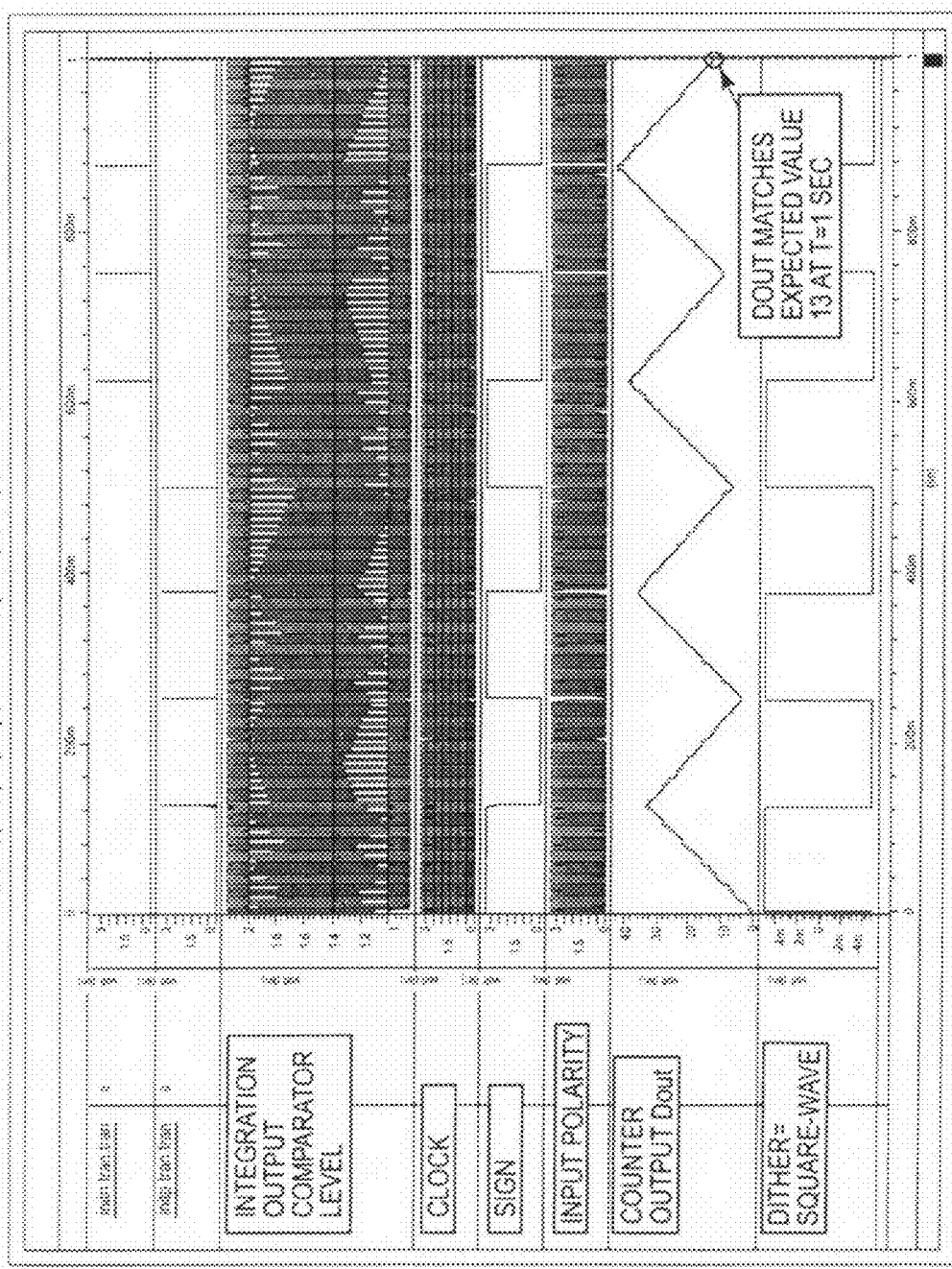
FIG. 15 illustrates a simulation result (Va≠0, |Vin|<|Va|, with square-wave dither) of the analog-to-digital converter in accordance with the embodiment.
Figure 16:
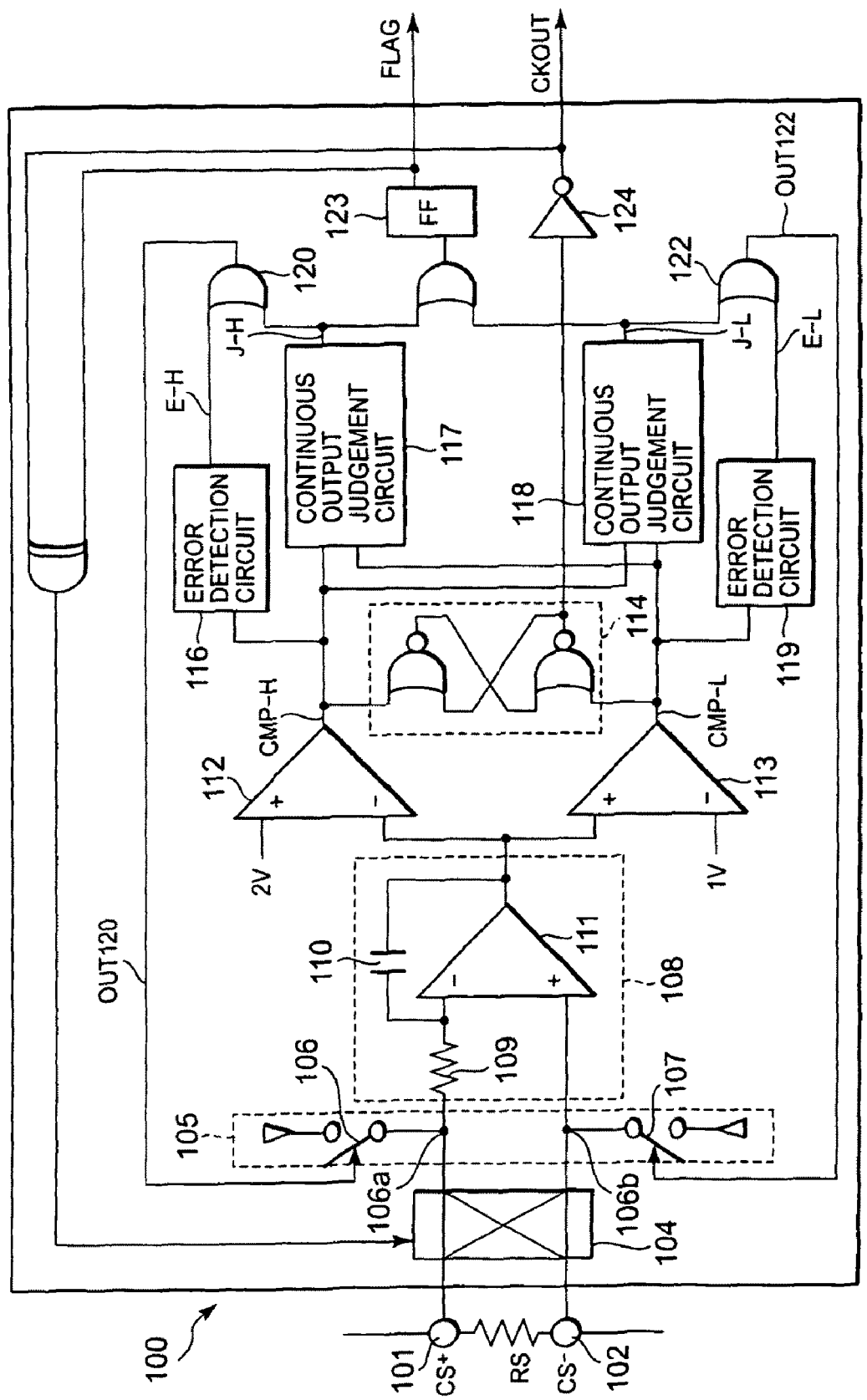
FIG. 16 explains an analog-to-digital converter related to the Related Art.
Figure 17:
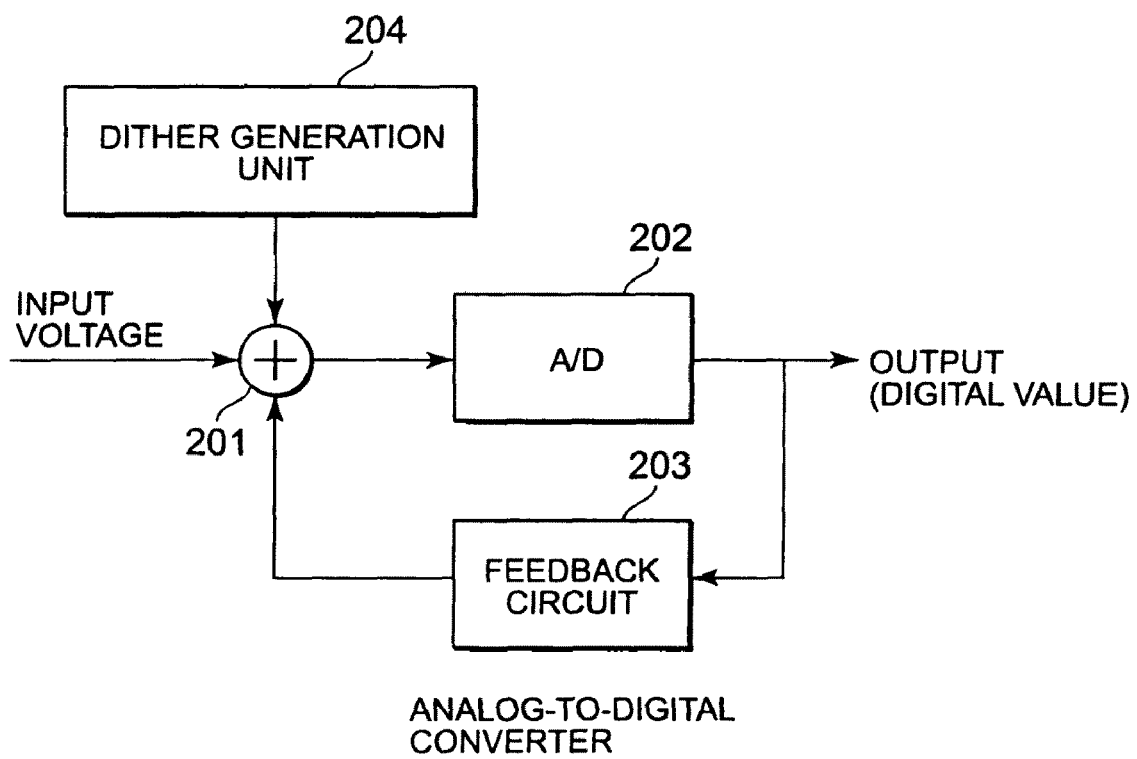
FIG. 17 explains an analog-to-digital converter related to the Related Art.

FIGS. 14 and 15 each illustrates a simulation result with offset Va (Va≈0) and with dither. FIG. 14 adds, as dither, a sin-wave dither having 4 Hz and 5 mV. FIG. 15 adds, as dither, a square-wave dither having 4 Hz and 5 mV. In FIGS. 14 and 15, the counter output Dout matches an expected value of 13.

That is, the count value can be obtained for each dither cycle by generating dither in such a manner that the number of times (D1) the count value is generated in the first half of one cycle of the dither is different from the number of times (D2) the count value is generated in the second half of the one cycle of the dither. This method can eliminate the dead band region, thereby enabling to improve the accuracy of the analog-to-digital converter.

Alternatively, the count value can be obtained for each dither cycle by generating dither in such a manner that the sum of the count value obtained in the first half of one cycle of the dither and the count value obtained in the second half of the one cycle of the dither is equal to or greater than 1. This method can eliminate the dead band region, thereby enabling to improve the accuracy of the analog-to-digital converter.

Next, a specific dither setting flow will be described by referring to FIGS. 3 and 4.

First, the control circuit 4 determines whether or not there is a dead band region (S1). If there is no dead band region, dither is turned off and the dither setting flow terminates.

Here, the condition where there is a dead band region is |Vin|≦|Va| as described above. If there is a dead band region, the control circuit 4 determines whether or not there is a need to improve the accuracy of the characteristic in the vicinity of the dead band region (S2). If a determination is made that there is a need to improve the accuracy of the characteristic in the vicinity of the dead band region, the control circuit 4 determines whether Vin≈Va or Vin<Va (S3). If a determination is made that not Vin≈Va nor Vin<Va, the control circuit 4 determines whether it is possible for Vd>>Vin (S4). If a determination is made that it is possible for Vd>>Vin, dither is set (S5). If a determination is made in S3 that Vin≈Va or Vin<Va, dither is also set (S5).

Next, a detailed dither setting flow will be described by referring to FIG. 4. In S10, the analog-to-digital converter calculates the time t1 required for a V-F conversion of a minimum input voltage for one count. In this case, R denotes an input resistance, C denotes an integrator capacitance, Vin (min) denotes minimum input amplitude, Vcom denotes an internal reference voltage, and Vr denotes a reference voltage. The value of t1 can be obtained from t1=4Vr*C*R/(Vin(min)−Vcom).

Next, the reading interval tr and the half dither cycle tdi are set (S11). Then, a determination is made as to whether to satisfy tr≧t1, tdi≧t1, and tr=W*2*tdi (W is an integer equal to or greater than 1) (S12 to S14). If one of these conditions is not satisfied, the process is returned to the setting of the reading interval tr and the half dither cycle tdi (S11). If these conditions are satisfied, the dither amplitude Vd is set (S15). In this case, the input amplitude Vin and the offset Va of the amplifier (differential amplifier 8) are used.

When the dither amplitude Vd is set, first, a determination is made as to whether to satisfy Vd RC/tdi*N*2Vr*(Vin+Va) (S16). Here, N is a real number equal to or greater than 1. Then, a determination is made as to whether to satisfy Vd>>√(Vin²+Va²) (S17). Further, a determination is made as to whether to satisfy |Va²/(Vin²−Vd²)|<<1 (S18). If all the conditions from S16 to S18 are satisfied, the dither setting terminates. If one of the conditions from S16 to S18 is not satisfied, the process is returned to the setting of the dither amplitude Vd (S15) where Vd is set again.

Figure 3:
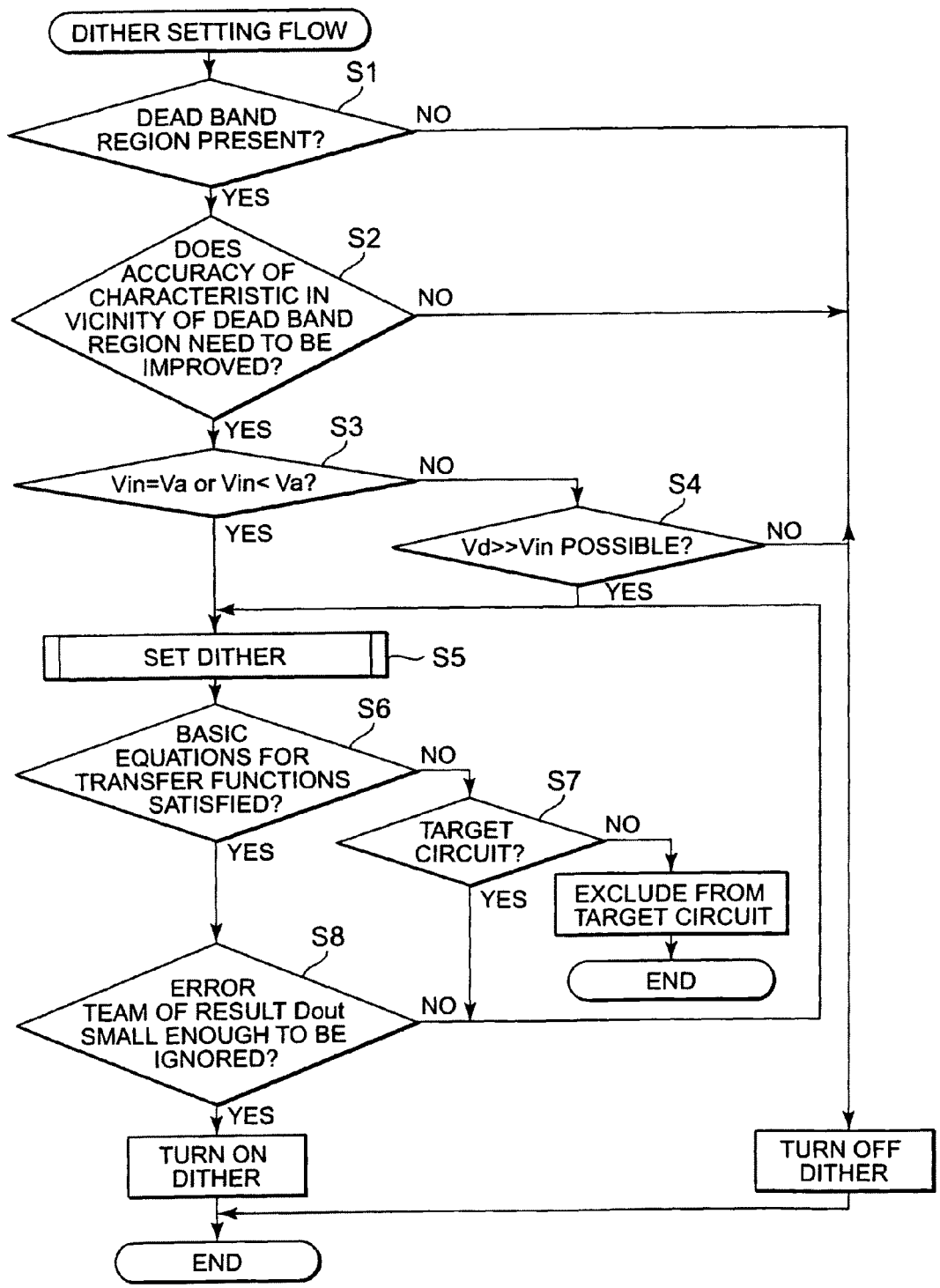
FIG. 3 is a flowchart for explaining dither setting flow of the analog-to-digital converter in accordance with the embodiment.
Figure 4:
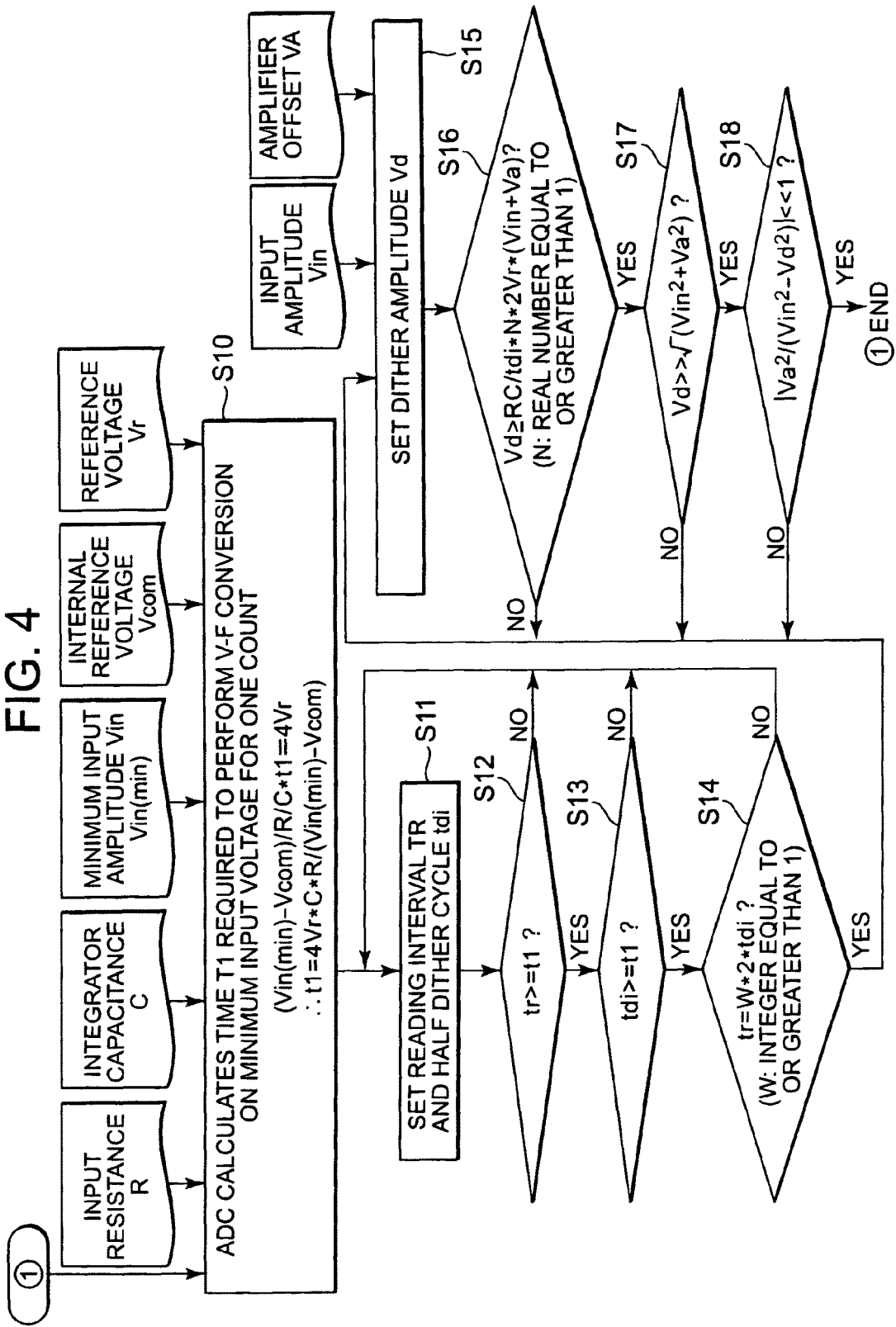
FIG. 4 is a flowchart for explaining dither setting flow of the analog-to-digital converter in accordance with the embodiment.

After the dither setting is completed based on the flowchart of FIG. 4, a determination is made in S6 of FIG. 3 as to whether to satisfy the basic equations for transfer functions (expressions 1-1 to 1-4). If the basic equations for transfer functions are not satisfied, a determination is made as to whether the target circuit is used or not (S7). If the target circuit is not used, the dither setting flow terminates. If the target circuit is used, the dither is set again (S5). If the basic equations for transfer functions are satisfied, a determination is made as to whether the error term of the counter output Dout is small enough to be ignored (S8). If the error term cannot be ignored, dither is set again (S5). If a determination is made that the error term can be ignored, dither is turned on and the dither Vd is added to the input signal Vin. Hereinbefore, the dither setting flow terminates.

The dither waveform may be any waveform as long as the waveform becomes zero when the waveform is integrated in the counter reading time. The waveform which becomes zero when the waveform is integrated in the counter reading time is, for example, a waveform which becomes zero when the waveform in one cycle (from T0 to T13) of dither in FIG. 2 is integrated. For example, a sine wave, a square wave, a triangular wave, a saw-tooth wave, and the like can be used. For example, the square-wave dither can be generated simply by dividing a clock. This method can suppress an increase in circuit area due to dither generation.

Figure 5:
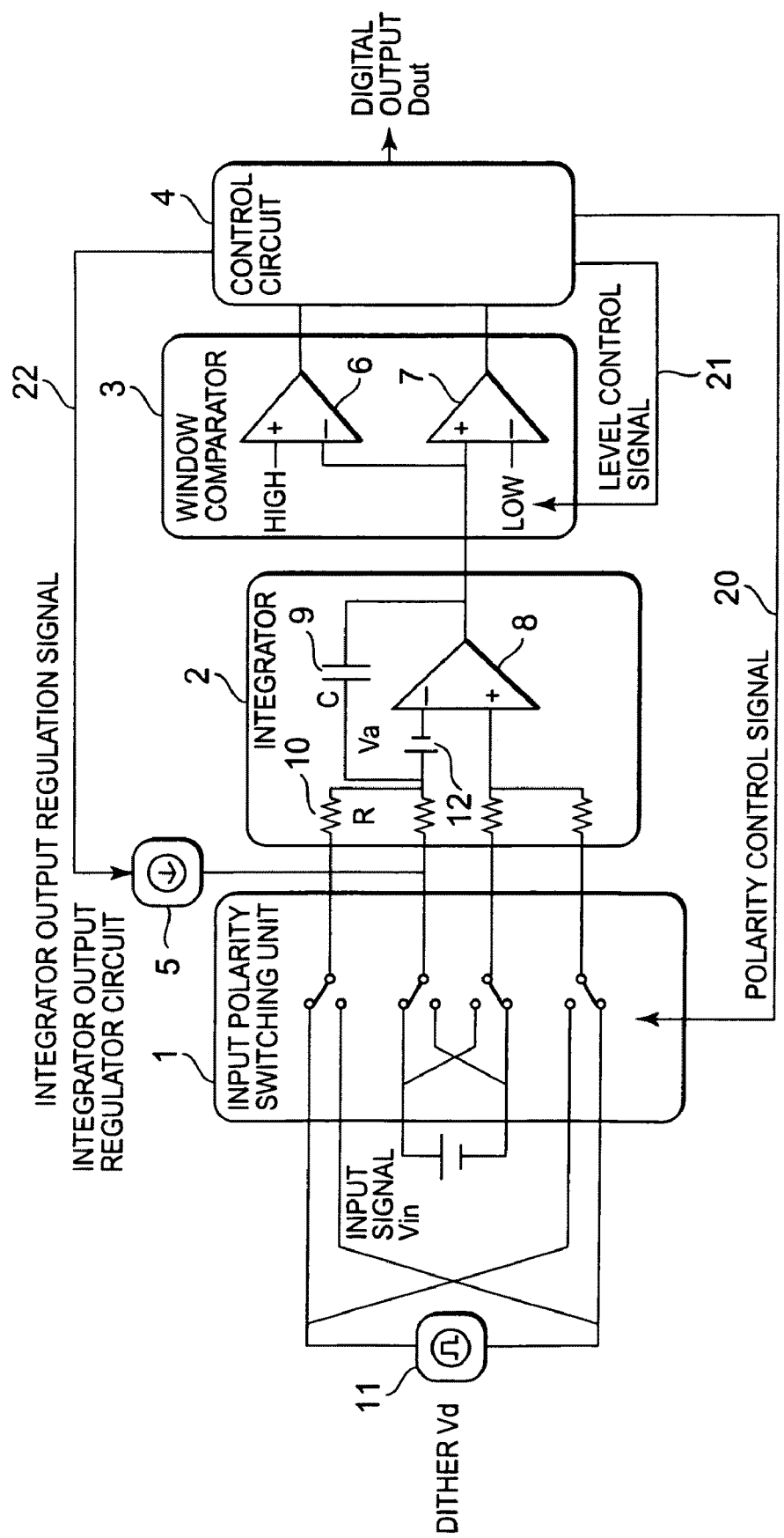
FIG. 5 illustrates another circuit example of the analog-to-digital converter in accordance with an embodiment.

FIG. 5 illustrates an example of the analog-to-digital converter using a square-wave dither. The analog-to-digital converter of FIG. 5 includes the input polarity switching unit 1 which has four switches. The two switches on the inner side thereof are used to switch the polarity of the input signal Vin; and the two switches on the outer side thereof are used to switch the polarity of the dither Vd. Other than the above, the analog-to-digital converter of FIG. 5 is the same as the analog-to-digital converter illustrated in FIG. 1.

In the analog-to-digital converter of FIG. 5, the integrator uses a differential input system to receive each of an input signal and dither via the input polarity switching unit 1. This system allows positive and negative polarity signals to be inputted to the integrator. An offset error occurring due to asymmetric dither can be corrected by saving a digital output value when the input signal is terminated to 0V, and subtracting the offset portion from the normal signal conversion result. Moreover, the polarity of the input signal can be determined by detecting the clock duty, or the like.

The analog-to-digital converter in accordance with the present embodiment described above can obtain the count value every dither cycle by adding dither to the input signal, and thus can eliminate the dead band region, thereby enabling to improve the accuracy of the analog-to-digital converter.

Accordingly, the analog-to-digital converter in accordance with the present embodiment can provide an analog-to-digital converter capable of performing analog-to-digital conversion with good accuracy even if the integrator has an offset.

Hereinbefore, the present invention has been described based on the above embodiments, but the present invention is not limited only to the configurations of the above embodiments. It is apparent that various variations, modifications, and combinations readily apparent to a person of ordinary skill in the art are intended to be included within the scope of the present invention as defined in the claims within the scope of the present patent application.

What is claimed is:

1. A analog-to-digital converter comprising:
a dither generation circuit which generates dither;
an input polarity switching unit which an input signal with the dither is inputted to and switches a polarity of the input signal;
an integrator which integrates the input signal with the dither outputted from the input polarity switching unit;
an integrator output regulator circuit which regulates an output voltage of the integrator;
a window comparator which includes a high-voltage-side comparator having a first reference voltage and a second reference voltage higher than the first reference voltage, and a low-voltage-side comparator having a third reference voltage and a fourth reference voltage lower than the third reference voltage, as well as compares an output voltage of the integrator with the first to fourth reference voltages; and
a control circuit which uses the comparison result of the window comparator to control the input polarity switching unit, the integrator output regulator circuit, and the window comparator as well as to generate a digital signal,
wherein the control circuit controls such that when the output voltage of the integrator reaches the first reference voltage or the third reference voltage, a clock signal is inverted, and when the output voltage of the integrator reaches the second reference voltage or the fourth reference voltage, a sign is inverted, and a count value is generated based on the clock signal and the sign, and the dither generation circuit generates dither in such a manner that a cycle in which the digital signal is read is an integral multiple of one cycle of the dither as well as that the number of times the count value is generated in the first half of one cycle of the dither is different from the number of times the count value is generated in the second half of the one cycle of the dither.

2. The analog-to-digital converter according to claim 1, wherein the dither generation circuit generates dither in such a manner that the sum of the count value obtained in the first half of one cycle of the dither and the count value obtained in the second half of the one cycle of the dither is equal to or greater than 1.

3. The analog-to-digital converter according to claim 1, wherein the dither generation circuit generates dither in such a manner that the sign of the count value in the first half cycle of the dither is contrary to the sign of the count value in the second half cycle thereof.

4. The analog-to-digital converter according to claim 1, wherein the dither generation circuit generates dither in such a manner that an amplitude value of the dither is larger than each value of an offset value of the integrator and an amplitude value of the input signal.

5. The analog-to-digital converter according to claim 1, wherein the dither generation circuit generates dither so as to satisfy $Vd \geq RC/tdi*N*2Vr*(Vin+Va)$, where Vd denotes a dither amplitude, R denotes an integrator input resistance, C denotes an integrator capacitor value, tdi denotes a dither half cycle, N denotes the number of times the output voltage of the integrator reaches from the first reference voltage to the third reference voltage or from the third reference voltage to the first reference voltage within tdi, 2Vr denotes a voltage difference between the first reference voltage and the third reference voltage, Vin denotes an input signal voltage, and Va denotes an offset voltage.

6. The analog-to-digital converter according to claim 1, wherein the dither generation circuit generates dither so as to satisfy $Vd >> \sqrt{(Vin^2+Va^2)}$, where Vd denotes a dither amplitude, Vin denotes an input signal voltage, and Va denotes an offset voltage.

7. The analog-to-digital converter according to claim 1, wherein the dither generation circuit generates dither so as to satisfy $|Va^2/(Vin^2-Vd^2)|| << 1$, where Vd denotes a dither amplitude, Vin denotes an input signal voltage, and Va denotes an offset voltage.

8. The analog-to-digital converter according to claim 1, wherein the control circuit counts +1 when the sign is plus and the clock signal rises, and counts −1 when the sign is minus and the clock signal rises.

* * * * *